United States Patent
Kiyota et al.

(10) Patent No.: US 10,923,880 B2
(45) Date of Patent: Feb. 16, 2021

(54) SEMICONDUCTOR LASER DEVICE, DIFFRACTION GRATING STRUCTURE, AND DIFFRACTION GRATING

(71) Applicant: FURUKAWA ELECTRIC CO., LTD., Tokyo (JP)

(72) Inventors: Kazuaki Kiyota, Tokyo (JP); Yasumasa Kawakita, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/058,356

(22) Filed: Aug. 8, 2018

(65) Prior Publication Data

US 2018/0351328 A1 Dec. 6, 2018

Related U.S. Application Data

(63) Continuation of application No. PCT/JP2017/005166, filed on Feb. 13, 2017.

(30) Foreign Application Priority Data

Feb. 12, 2016 (JP) .................................. 2016-025315

(51) Int. Cl.
*H01S 5/12* (2006.01)
*H01S 5/06* (2006.01)
(Continued)

(52) U.S. Cl.
CPC .......... *H01S 5/1209* (2013.01); *H01S 5/0612* (2013.01); *H01S 5/1237* (2013.01);
(Continued)

(58) Field of Classification Search
CPC .... H01S 5/1209; H01S 5/0612; H01S 5/1237; H01S 2301/176; H01S 5/0261; H01S 5/1215; H01S 5/06256; H01S 5/3434
See application file for complete search history.

(56) References Cited

U.S. PATENT DOCUMENTS 6,141,370 A    10/2000  Avrutsky et al.
6,937,638 B2    8/2005  Fish et al.
(Continued)

FOREIGN PATENT DOCUMENTS

JP    5-333223      12/1993
JP    2003-152274    5/2003
(Continued)

OTHER PUBLICATIONS

International Search Report dated Apr. 4, 2017 in PCT/JP2017/005166, filed on Feb. 13, 2017 (with English Translation).
(Continued)

*Primary Examiner* — Xinning(Tom) Niu

(74) *Attorney, Agent, or Firm* — Oblon, McClelland, Maier & Neustadt, L.L.P.

(57) ABSTRACT

A semiconductor laser device is a vernier-type wavelength-tunable semiconductor laser device including an optical resonator, constituted by first and second reflective elements having reflection comb spectra in which reflection peaks are arranged on a wavelength axis in a substantially periodic manner and having mutually different periods. At least one of the first and second reflective elements has a sampled grating structure having a reflection comb spectrum in which reflection phases at the respective reflection peaks are aligned and the intensity of a reflection peak outside a set laser emission wavelength bandwidth is lower than the intensity of a reflection peak within the laser emission wavelength bandwidth.

12 Claims, 17 Drawing Sheets

(51) Int. Cl.
H01S 5/026 (2006.01)
H01S 5/0625 (2006.01)
H01S 5/343 (2006.01)

(52) U.S. Cl.
CPC ......... H01S 5/0261 (2013.01); H01S 5/06256 (2013.01); H01S 5/1215 (2013.01); H01S 5/3434 (2013.01); H01S 2301/176 (2013.01)

(56) References Cited

U.S. PATENT DOCUMENTS

| | | | |
|---|---|---|---|
| 7,643,532 | B2 | 1/2010 | Fish et al. |
| 7,894,693 | B2* | 2/2011 | Fujii ............... H01S 5/0612 385/15 |
| 8,009,947 | B2 | 8/2011 | Fujii |
| 2003/0091300 | A1 | 5/2003 | Irino et al. |
| 2004/0042516 | A1 | 3/2004 | Takaki et al. |
| 2004/0264514 | A1* | 12/2004 | Kim ............... G02B 6/124 372/20 |
| 2010/0272133 | A1* | 10/2010 | Kato ............... H01S 5/06256 372/20 |
| 2010/0296539 | A1 | 11/2010 | Fukuda et al. |

FOREIGN PATENT DOCUMENTS

| | | |
|---|---|---|
| JP | 2004-128372 | 4/2004 |
| JP | 4283869 | 6/2009 |
| JP | 2010-258297 | 11/2010 |
| JP | 2011-003886 | 1/2011 |
| JP | 5692330 | 4/2015 |
| JP | 2015-106664 | 6/2015 |

OTHER PUBLICATIONS

Written Opinion dated Apr. 4, 2017 in PCT/JP2017/005166, filed on Feb. 13, 2017.
Ishikawa, T. et al. "Narrow Spectral Linewidth Full-Band Wavelength Tunable Lasers for Digital Coherent Communication Systems," 2013, pp. 10 (with English Translation).
Avrutsky, I. et al. "Design of Widely Tunable Semiconductor Lasers and the Concept of Binary Superimposed Gratings (BSG's)," IEEE Journal of Quantum Electronics, vol. 34, No. 4, 1998, pp. 13.
Ibsen, M. et al. "Sinc-Sampled Fiber Bragg Gratings for Identical Multiple Wavelength Operation," IEEE Photonics Technology Letters, vol. 10, No. 6, 1998, pp. 3.
Ohki, Y. et al. "Pump Laser Module for Co-propagating Raman Amplifier," Furukawa Review No. 24, 2003, pp. 13 (with English Translation).
Office Action dated Nov. 4, 2020 in Japanese Application No. 2017-567025, along with an English translation.
"Multi-wavelength laser array structure using sampled grating structure", along with an English translation (2015).
Office Action dated Sep. 9, 2020 in Chinese Application No. 201780010513.2, along with an English translation.
"A New Sampled Grating Multi-Wavelength Laser Array", along with an English translation (2015).

* cited by examiner

INVERSION

THINNING (A)

IN CASE OF 1/2

THINNING (A)

IN CASE OF 1/3

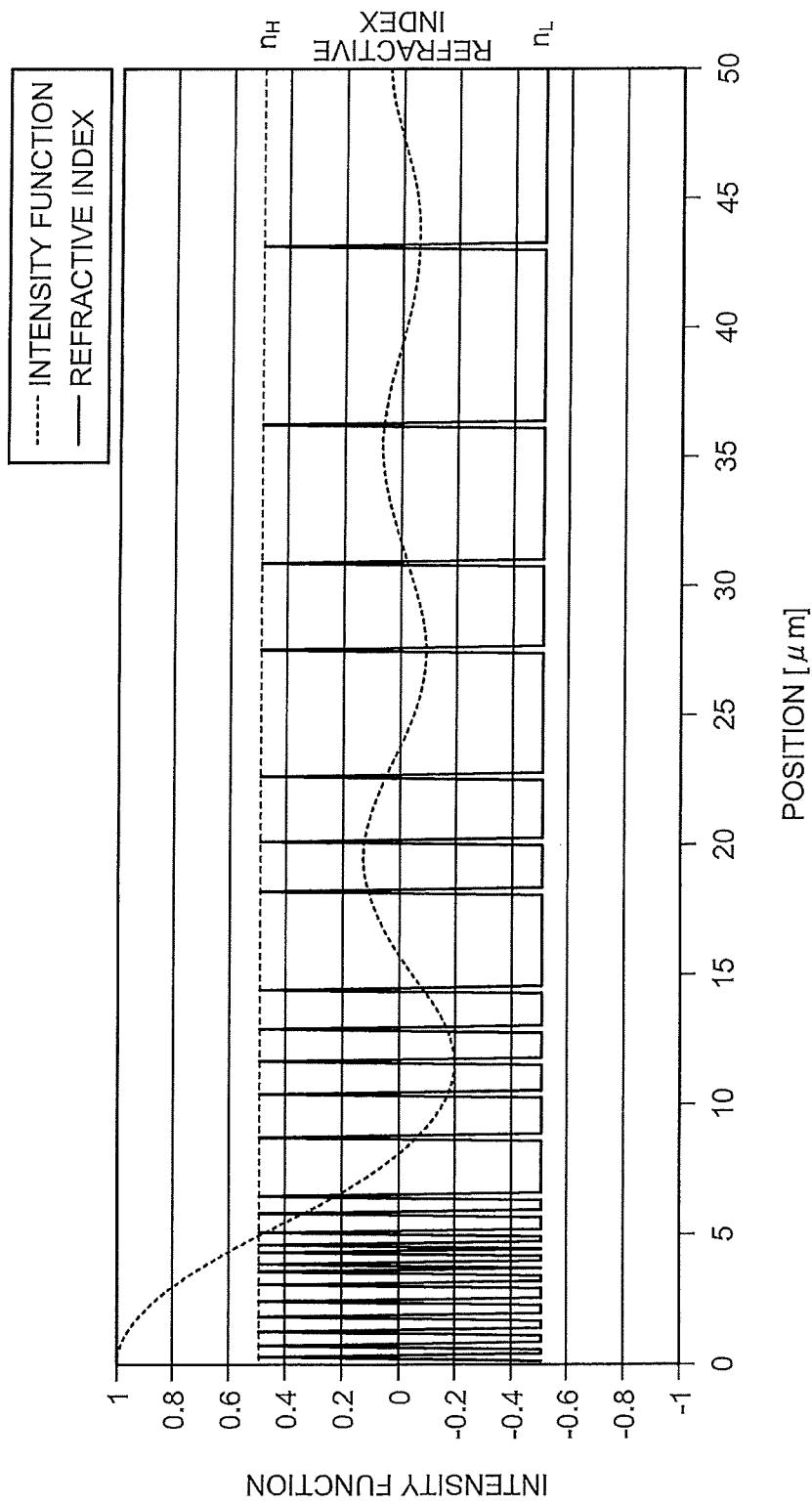

THINNING (B)

IN CASE OF 1/2

THINNING (B)

IN CASE OF 1/3

SEMICONDUCTOR LASER DEVICE, DIFFRACTION GRATING STRUCTURE, AND DIFFRACTION GRATING

CROSS-REFERENCE TO RELATED APPLICATION(S)

This application is a continuation of International Application No. PCT/JP2017/005166, filed on Feb. 13, 2017 which claims the benefit of priority of the prior Japanese Patent Application No. 2016-025315, filed on Feb. 12, 2016, the entire contents of which are incorporated herein by reference.

BACKGROUND OF THE INVENTION

1. Field of the Invention

The present disclosure relates to a semiconductor laser device, a diffraction grating structure, and a diffraction grating.

2. Description of the Related Art

In the past, a wavelength-tunable laser device has been used which is obtained by combining two reflective elements. Each of the reflective elements has a reflection comb spectrum in which reflection peaks are arranged substantially in a periodic manner on a wavelength axis. If two reflective elements are used in combination in which wavelength intervals between reflection peaks in the reflection comb spectra are slightly different from each other, it is possible to realize wavelength tuning over a wide bandwidth due to an effect that is called a vernier effect.

The vernier effect is as follows. Since the wavelength interval between reflection peaks is different between the reflection comb spectra of the two reflective elements, the two spectra simultaneously coincide with each other only at any one of a plurality of reflection peaks thereof, an optical resonator is formed at a wavelength thereof, and laser emission occurs. Further, when the wavelength of one of the reflection comb spectra is slightly changed by changing a refractive index, a reflection peak coinciding with that of the other reflection comb spectrum becomes shifted to another wavelength. Then, the optical resonator is formed at a wavelength significantly different from the previous wavelength, and laser emission occurs. Even if a change in wavelength characteristics caused by the refractive index change is slight, it is possible to obtain a greater change in a laser emission wavelength according to the above-described vernier effect. The amount of the refractive index change that can be practically obtained is limited, and thus, such a wavelength tuning technique using the vernier effect is a highly effective technique for a wavelength-tunable laser device having a wide bandwidth. As a wavelength-tunable laser device using such a vernier effect, a scheme that is called a CSG-DR laser is proposed (Japanese Unexamined Patent Application Publication No. 2015-106664, SEI TECHNICAL REVIEW No. 183 on July 2013, from pp. 50, and the like).

A DBR laser using a distributed Bragg reflector (DBR) that utilizes two sampled gratings (SG) has been mainly used as a related art wavelength-tunable laser device using the vernier effect. The SG is one of techniques for implementing a reflection comb spectrum with a diffraction grating in which short diffraction gratings are arranged in a spatially periodic manner (hereinafter, this period will be referred to as a sampling period).

Compared with the related art DBR laser, the CSG-DR laser is characterized in that one SG is used as an active region including an active layer. In the case of the related art DBR laser, an active region (gain portion) is positioned between the two SGs. Thus, it is necessary to provide a certain length between the two SGs. Then, it is difficult to match phase conditions of light between the two SGs, and thus, it is necessary to provide a phase adjustment region to perform phase adjustment between the SGs. It is complex to control the phase adjustment region since the phase adjustment control needs to be constantly performed while monitoring an operation of a laser, so that there is a problem that an inspection process at the time of manufacture becomes complex. On the other hand, the CSG-DR laser has an advantage that since the active region is included in the SG, no phase adjustment region is required and the above problem does not arise.

Meanwhile, reflectivities of the respective reflection peaks of the reflection comb spectrum do not even in principle in the typical SG, a reflectivity is higher at a reflection peak closer to the center of the entire bandwidth of the reflection comb spectrum, and a reflectivity is lower at a reflection peak farther from the center of the bandwidth. It is possible to reduce variations in reflectivity for each reflection peak in the reflection comb spectrum and make the reflectivities more even by shortening a length of each diffraction grating constituting the SG (decreasing the number of periods). However, when the variation of the reflectivity is decreased in this manner, a reflectivity of a reflection peak outside a desired bandwidth also increases. Here, the desired bandwidth is a wavelength bandwidth in which the laser emission desirably occurs in the laser device, and will be referred to as a laser emission wavelength bandwidth hereinafter. If the reflection peak outside the laser emission wavelength bandwidth becomes high in this manner, the laser emission may occur at the wavelength of the reflection peak outside the laser emission wavelength bandwidth. For example, in a wavelength-tunable laser, emission may occur at a wavelength outside a laser emission wavelength bandwidth on a long wavelength side when emission is desirably caused on a short wavelength side of a wavelength-tunable wavelength bandwidth which is the laser emission wavelength bandwidth. This is because a phenomenon, called a regression mode, in which reflection peaks of two reflection comb spectra coincide with each other outside a desired bandwidth (laser oscillation wavelength bandwidth) occurs when the vernier is formed with the two reflection comb spectra.

A technique described in Japanese Patent No. 4283869 is used in the CSG-DR laser in order to avoid emission in this regression mode. That is, an SG of a passive region on a side different from an active region among SGs has a structure in which a plurality of SGs with different sampling periods are connected. This is called a CSG-DBR structure. In this manner, the regression mode can be suppressed.

As described above, the CSG-DR laser has the CSG-DBR structure in which the plurality of SGs with different sampling periods are included in the SG of the passive region. Typically, three types of SGs having different sampling periods are used as described in Japanese Unexamined Patent Application Publication No. 2015-106664. That is, the CSG-DR laser utilizes the vernier having four reflection comb spectra, which is configured using the SG in the active region and the three types of SGs included in the CSG-DBR in the passive region. Therefore, the laser emission occurs at the wavelength controlled such that all the reflection peaks of these four kinds of SGs coincide with each other.

However, it is necessary to control the plurality of reflection comb spectra in this manner in this structure, and thus, the control is difficult, and as a result, there is a problem that characteristics easily vary for each wavelength channel of the wavelength-tunable laser. If it is difficult to control the reflection peaks of the respective reflection comb spectra to completely coincide with each other, the reflectivity becomes lower than a desired value, and thus, an emission threshold of the laser increases. Recently, an emission frequency linewidth needs to be narrow for a coherent transmission application in wavelength-tunable lasers for communication. However, when the emission threshold is increased by a certain channel in this manner, a frequency linewidth also increases, which is not suitable for the coherent transmission.

Thus, there is a request that it is desired to implement wavelength tuning by the vernier with fewer types of reflection comb spectra in place of the vernier formed of the four reflection comb spectra. The original purpose of using the three types of SGs in the passive region is to suppress the regression mode. That is, it is considered that the vernier can be formed with fewer types of reflection comb spectra, and the control becomes easy so that it is possible to reduce the characteristic variation for each channel if the problem of the regression mode can be solved by another means.

There is a binary superimposed grating (BSG) described in U.S. Pat. No. 6,141,370 and IEEE JOURNAL OF QUANTUM ELECTRONICS, VOL. 34, NO. 4, from pp. 729 as a technique in which a reflection peak of a reflection comb spectrum outside a laser emission wavelength bandwidth is suppressed, in place of the related art SG. This implements a shape in which diffraction gratings having a plurality of periods are superimposed on each other by addition, as a diffraction grating including a plurality of phase shifts. The BSG has a reflection comb peak only within a desired laser emission wavelength bandwidth, depending on its design, and can have a characteristic of suppressing a reflection peak outside the bandwidth.

If such a characteristic of the BSG is used, there is no reflection peak outside the laser emission wavelength bandwidth in the first place, and thus, it is possible to avoid the problem of the regression mode. In practice, Japanese Patent No. 5692330 discloses a configuration in which a diffraction grating called a PG, which is considered to have the same structure as the BSG, is used in a passive region of a DR laser. However, the DR laser described in Japanese Patent No. 5692330 is characterized by having a phase shift unit for injection of a control current. That is, a phase adjustment region is indispensable in a laser configuration using the BSG (or the PG), and there is a problem that the complexity of the phase control increases even if the vernier control becomes simple.

Japanese Patent No. 5692330 describes that a threshold gain difference between competitive modes is improved by providing the phase adjustment region, but has no consideration on the reason why the phase adjustment region is required in the case of using the BSG (or the PG) in the first place. That is, there is no known configuration that uses a reflection comb spectrum in which a reflection peak outside a laser emission wavelength bandwidth is suppressed as in the BSG (or the PG) and does not require a phase adjustment region, and further, which condition that makes the configuration possible has not been known, either.

SUMMARY OF THE INVENTION

The present disclosure has been made in view of the above, and is directed to a semiconductor laser device, a diffraction grating structure, and a diffraction grating.

According to a first aspect of the present disclosure, there is provided a vernier-type wavelength-tunable semiconductor laser device comprising an optical resonator, constituted by first and second reflective elements having reflection comb spectra in which reflection peaks are arranged on a wavelength axis in a substantially periodic manner and having mutually different periods, wherein at least one of the first and second reflective elements has a sampled grating structure having a reflection comb spectrum in which reflection phases at the respective reflection peaks are aligned and an intensity of a reflection peak outside a set laser emission wavelength bandwidth is lower than an intensity of a reflection peak within the laser emission wavelength bandwidth.

According to a second aspect of the present disclosure, there is provided a vernier-type wavelength-tunable semiconductor laser device comprising an optical resonator, constituted by first and second reflective elements having reflection comb spectra in which reflection peaks are arranged on a wavelength axis in a substantially periodic manner and having mutually different periods, wherein at least one of the first and second reflective elements is a diffraction grating having a sampled grating structure including a plurality of diffraction grating structures, each of the diffraction grating structure having a structure that is substantially centrosymmetric in a light progressing direction, and has the sampled grating structure having a reflection comb spectrum in which an intensity of a reflection peak outside a set laser emission wavelength bandwidth is lower than an intensity of a reflection peak within the laser emission wavelength bandwidth.

According to a third aspect of the present disclosure, there is provided a vernier-type wavelength-tunable semiconductor laser device comprising an optical resonator, constituted by first and second reflective elements having reflection comb spectra in which reflection peaks are arranged on a wavelength axis in a substantially periodic manner and having mutually different periods, wherein at least one of the first and second reflective elements is a diffraction grating of a sampled grating structure including a plurality of diffraction grating structures, a plurality of sets of a high-refractive-index portion and a low-refractive-index portion having a lower refractive index than the high-refractive-index portion are alternately arranged in a predetermined direction in the diffraction grating structure, when a structure in which a plurality of sets of the high-refractive-index portion and the low-refractive-index portion are arranged in an alternately periodic manner is set as a basic structure, the diffraction grating structure has a structure formed by omitting at least one of the high-refractive-index portions from the basic structure, omitting at least one of the low-refractive-index portions, omitting at least one boundary between the high-refractive-index portion and the low-refractive-index portion, or performing a combination thereof, and the diffraction grating structure has a structure including a plurality of portions with alternating arrangement of the high-refractive-index portion and the low-refractive-index portion phase shifted by a ½ period from the basic structure.

According to a fourth aspect of the present disclosure, there is provided a semiconductor laser device comprising: a first reflection film; a second reflection film having a higher reflectivity than the first reflection film; an active layer arranged between the first reflection film and the second reflection film; and a diffraction grating provided along the active layer in vicinity of the active layer and having a diffraction grating structure, wherein a plurality of sets of a high-refractive-index portion and a low-refractive-index portion having a lower refractive index than the high-refractive-index portion are alternately arranged in a predetermined direction in the diffraction grating structure, when a structure in which a plurality of sets of the high-refractive-index portion and the low-refractive-index portion are arranged in an alternately periodic manner is set as a basic structure, the diffraction grating structure has a structure formed by omitting at least one of the high-refractive-index portions from the basic structure, omitting at least one of the low-refractive-index portions, omitting at least one boundary between the high-refractive-index portion and the low-refractive-index portion, or performing a combination thereof, and the diffraction grating structure has a structure including a plurality of portions with alternating arrangement of the high-refractive-index portion and the low-refractive-index portion phase shifted by a ½ period from the basic structure, and laser emission is performed in a plurality of longitudinal modes.

According to a fifth aspect of the present disclosure, there is provided a diffraction grating structure obtained by alternately arranging a plurality of sets of a high-refractive-index portion and a low-refractive-index portion having a lower refractive index than the high-refractive-index portion in a predetermined direction, wherein when a structure in which a plurality of sets of the high-refractive-index portion and the low-refractive-index portion are arranged in an alternately periodic manner is set as the basic structure, the diffraction grating structure has a structure, formed by omitting at least one of the high-refractive-index portions from a basic structure, omitting at least one of the low-refractive-index portions, omitting at least one boundary between the high-refractive-index portion and the low-refractive-index portion, or performing a combination thereof, and the diffraction grating structure has a structure including a plurality of portions with alternating arrangement of the high-refractive-index portion and the low-refractive-index portion phase shifted by a ½ period from the basic structure.

The above and other objects, features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 11 is a graph illustrating an intensity function and a refractive index structure of a diffraction grating structure;

DETAILED DESCRIPTION OF THE PREFERRED EMBODIMENTS

Embodiments of a semiconductor laser device, a diffraction grating structure, and a diffraction grating according to the present disclosure will be described in detail below with reference to the drawings. Incidentally, the disclosure is not limited by the embodiments. In addition, the same or corresponding components will be denoted appropriately by the same reference signs in the respective drawings. Further, it should be noted that the drawings are schematic and relationship among dimensions of the respective components, a ratio of each component, and the like may differ from those of the actual. Portions having different relationships or ratios among their dimensions among the drawings may also be included.

First Embodiment

Figure 1:
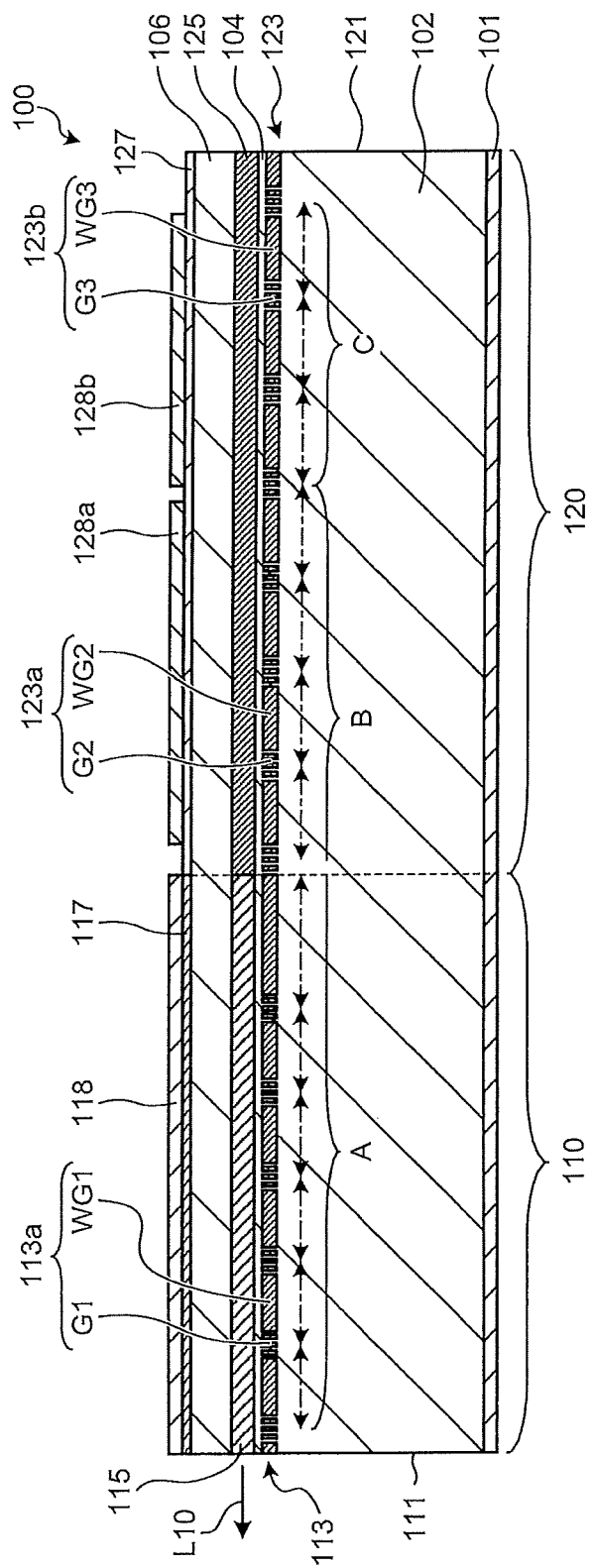
FIG. 1 is a schematic cross-sectional view of a semiconductor laser device according to a first embodiment cut along an optical waveguide direction.

FIG. 1 is a schematic cross-sectional view of a semiconductor laser device according to a first embodiment of the present disclosure cut along an optical waveguide direction (lateral direction of the paper). As illustrated in FIG. 1, a semiconductor laser device 100 includes a gain SG section 110 which is an SG-DFB section having a waveguide core layer 115, which is an active layer that emits light by current injection, and a passive SG section 120 which is a CSG-DBR section that is adjacent to the gain SG section 110 and has a waveguide core layer 125 which is a passive waveguide core layer. An anti-reflection film (not illustrated) is formed on facets 111 and 121 of the gain SG section 110 and the passive SG section 120, respectively.

In addition, the semiconductor laser device 100 includes: an n-type semiconductor layer 102 having an n-side electrode 101 formed on a back face thereof; a diffraction grating layer 113 formed on the n-type semiconductor layer 102 in the gain SG section 110; a diffraction grating layer 123 formed on the n-type semiconductor layer 102 in the passive SG section 120; an n-type spacer layer 104 formed on the diffraction grating layers 113 and 123; the waveguide core layer 115 formed on the n-type spacer layer 104 of the gain SG section 110; the waveguide core layer 125 formed on the n-type spacer layer 104 of the passive SG section 120; a p-type upper cladding layer 106 formed on the waveguide core layers 115 and 125; a contact layer 117 formed on the p-type upper cladding layer 106 of the gain SG section 110; a p-side electrode 118 formed on the contact layer 117; a passivation film 127 made of SiN and formed on the p-type upper cladding layer 106 of the passive SG section 120; and heaters 128a and 128b made of Ti/Au and formed on the passivation film 127.

The n-type semiconductor layer 102 has a structure in which a lower cladding layer made of n-type InP is formed on a substrate made of n-type InP.

The diffraction grating layer 113 as a reflective element has an SG structure, and has a region A where a plurality of segments 113a are arranged in the optical waveguide direction. The segments 113a are discretely present at predetermined periods. Each of the segments 113a is formed of a diffraction grating G1 and a waveguide region WG1. The diffraction grating G1 is a distributed Bragg reflection region where a portion between n-type GaInAsP layers each having a bandgap wavelength of 1.23 μm (hereinafter referred to as 1.23 Q) is embedded with a semiconductor material (n-type InP) as the n-type spacer layer 104. The waveguide region WG1 is connected to the diffraction grating G1 in an optical waveguide direction and is formed using an n-type GaInAsP layer having 1.23 Q that is continuously present. The region A has the six segments 113a. A length of the segment 113a is about 160 μm. However, a segment adjacent to the passive SG section 120 among the segments 113a has a structure in which the waveguide region WG1 is longer than those of the other segments and substantially the one diffraction grating G1 is eliminated. There is a known effect of suppressing spatial hole burning when using such a structure in which the diffraction grating is eliminated.

The waveguide core layer 115 is a waveguide region made of GaInAsP and continuously present in the optical waveguide direction. The waveguide core layer 115 has an MQW-SCH structure formed of an MQW layer that includes four quantum well layers each having a thickness of 5 nm and a barrier layer having a thickness of 10 nm and SCH layers arranged so as to sandwich the MQW layer therebetween. A thickness of the MQW layer is, for example, 40 nm to 60 nm, and a thickness of the SCH layer is, for example, 30 nm. The diffraction grating layer 113 is arranged along the waveguide core layer 115 in the vicinity of the waveguide core layer 115 with the n-type spacer layer 104 interposed between the diffraction grating layer 113 and the waveguide core layer 115. Incidentally, the waveguide core layer 115 in the gain SG section 110 may be configured using a TDA structure that has a structure in which an active layer having a gain and a passive waveguide core layer having no gain are alternately arranged along the optical waveguide direction.

The waveguide core layer 125 is made of GaInAsP having 1.23 Q. The p-type upper cladding layer 106 is made of p-type InP. The contact layer 117 is made of p-type GaInAs. Incidentally, a part of the p-type upper cladding layer, which is positioned immediately above the waveguide core layer 125 of the passive SG section 120, may be replaced with a layer made of i-InP.

The diffraction grating layer 123 as a reflective element has a CSG structure and has a region B and a region C. In the region B, four segments 123a are arranged in the optical waveguide direction. The segments 123a are discretely present at predetermined periods and each of the segments 123a is formed of a diffraction grating G2 and a waveguide region WG2. The diffraction grating G2 is a distributed Bragg reflection region where a portion between n-type GaInAsP layers each having 1.23 Q is embedded with n-type InP. The waveguide region WG2 is connected to the diffraction grating G2 in the optical waveguide direction and is formed using an n-type GaInAsP layer having 1.23 Q that is continuously present. In the region C, three segments 123b are arranged in the optical waveguide direction. Each of the segments 123b is formed of a diffraction grating G3 and a waveguide region WG3. The diffraction grating G3 is a distributed Bragg reflection region where a portion between n-type GaInAsP layers each having 1.23 Q is embedded with n-type InP. The diffraction grating G3 is connected to the diffraction grating G3 in the optical waveguide direction and is formed using an n-type GaInAsP layer having 1.23 Q that is continuously present. Lengths of the segments 123a and 123b are about 177 μm and about 184 μm, respectively. The heaters 128a and 128b are arranged above the region B and the region C, respectively. The heaters 128a and 128b are provided to heat the passive SG section 120 and change a refractive index thereof.

Incidentally, a semiconductor-layered structure of the semiconductor laser device 100 has a known embedded heterostructure as a waveguide structure for guiding light in the optical waveguide direction (lateral direction of the paper) in a cross section perpendicular to the paper surface of FIG. 1.

Figure 2:
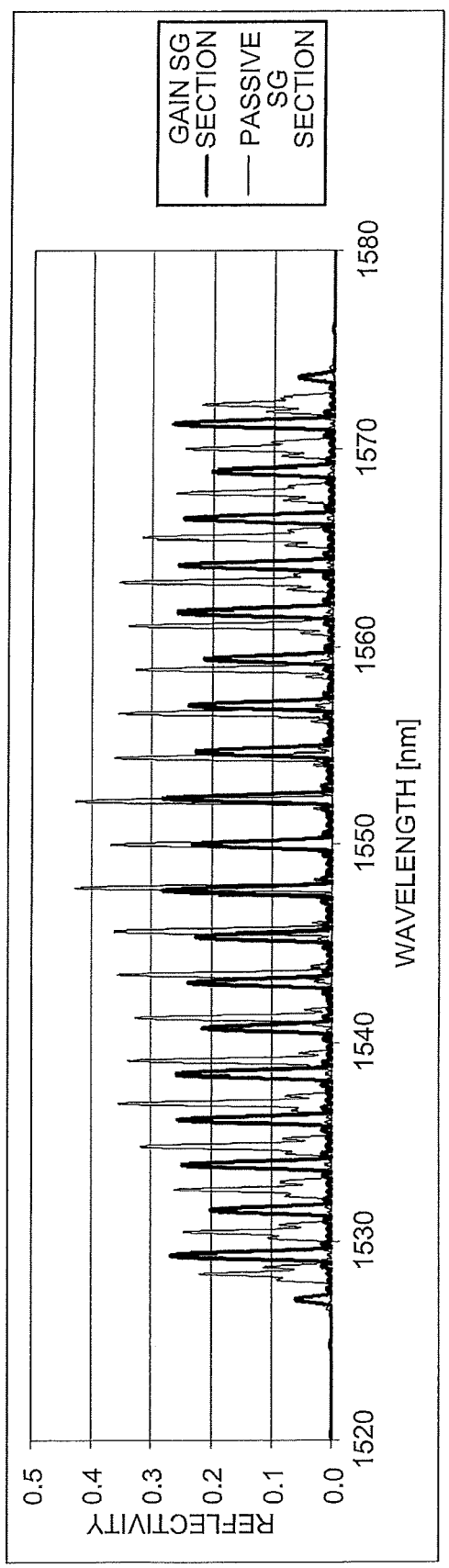
FIG. 2 is a graph illustrating an example of reflection spectra of a gain SG section and a passive SG section.

The semiconductor laser device 100 operates as a wavelength-tunable laser. FIG. 2 is a graph illustrating reflection spectra of the gain SG section 110 and the passive SG section 120 of the semiconductor laser device 100. An SG structure has a reflection comb spectrum in which reflection peaks are arranged on a wavelength axis in a substantially periodic manner and a wavelength interval between reflection peaks is inversely proportional to a length of a segment. As described above, the segment 113a in the gain SG section 110 and the segments 123a, 123b in the passive SG section 120 have different length. Therefore, the wavelength interval (the interval between adjacent peaks of the reflectivity) of the reflection comb spectrum is different between the gain SG section 110 and the passive SG section 120 as illustrated in FIG. 2. Therefore, in the semiconductor laser device 100, it is possible to cause laser emission only at a wavelength at which the reflection peaks coincide with each other between the two reflection comb spectra due to a vernier effect occurring between the two reflection comb spectra. At the same time, it is possible to perform a wavelength-tunable operation by adjusting reflection peaks that are caused to coincide with each other by changing the refractive index of the passive SG section 120. Incidentally, FIG. 2 illustrates a state where the reflection peaks of the two reflection comb spectra coincide with each other at a wavelength of 1550 nm. Additionally, a more specific design to obtain the reflection spectrum as illustrated in FIG. 2 will be described in detail later.

As a specific operation, first, a voltage is applied between the n-side electrode 101 and the p-side electrode 118 to inject a driving current in the gain SG section 110. The driving current is injected into the waveguide core layer 115 of the gain SG section 110. Then, the waveguide core layer 115 functions as an active layer and emits light having a predetermined wavelength bandwidth.

On the other hand, a current is supplied to heat the heaters 128a and 128b in the passive SG section 120, so that the diffraction grating layer 123 of the passive SG section 120 is heated. With this, the wavelength comb spectrum of the passive SG section 120 is shifted overall along the wavelength axis. As a result, the wavelength at which the reflection peaks coincide with each other between the wavelength comb spectrum of the gain SG section 110 and the wavelength comb spectrum of the passive SG section 120 is adjusted. Further, an optical resonator is formed by an SG-DFB structure of the gain SG section 110 and a CSG-DBR structure of the passive SG section 120 at the coincident wavelength, and the semiconductor laser device 100 mainly outputs laser light L10 only from the facet 111 of the gain SG section 110.

Manufacturing Method

An example of a method for manufacturing the semiconductor laser device 100 will be briefly described. First, a lower cladding layer and a diffraction grating layer that is to be the diffraction grating layers 113 and 123 are formed on a semiconductor substrate by a crystal growth method such as metal organic chemical vapor deposition (MOCVD). Subsequently, patterning is performed on the diffraction grating layer by an electron beam exposure apparatus to form patterns of the diffraction gratings G1, G2, and G3 on the diffraction grating layer. At this time, it is important to form the pattern so as to form a desired diffraction grating. Subsequently, etched portions are embedded with n-type InP to form the diffraction grating layers 113 and 123, and the n-type spacer layer 104, the waveguide core layer 115 as the active layer, and a part of the p-type upper cladding layer 106 are grown in this order on the patterns by MOCVD or the like. Subsequently, the active layer in a region that is to be the passive SG section 120 is removed by etching, and the waveguide core layer 125 and a part of the upper cladding layer made of i-InP are embedded in the region by MOCVD. Subsequently, the embedded heterostructure is formed by a known method. Then, the remaining portion of the p-type upper cladding layer 106 and the contact layer 117 are grown on the whole embedded heterostructure by MOCVD or the like.

Thereafter, after an unnecessary portion of the contact layer 117 is removed, the passivation film 127, the p-side electrode 118 for current injection, the heaters 128a and 128b are formed. Then, the passivation film 127 is removed in a current injection portion. The p-side electrode 118 and an electrode pad, substrate polishing, the n-side electrode 101, and the like are formed. Further, the facets 111 and 121 are formed by cleavage, the anti-reflection film is formed on the facets 111 and 121, and element isolation is performed, whereby the semiconductor laser device 100 is completed. All these steps can be carried out by known methods. Incidentally, when an SOA and a light-absorbing region are provided in a semiconductor laser device, the SOA and the light-absorbing region may be formed simultaneously with these steps, or may be formed in another step.

Method of Designing Diffraction Grating

Next, a design of a diffraction grating structure of the diffraction gratings G1, G2, and G3 in the first embodiment will be described. Before describing the design, however, characteristics of related art SG and BSG will be examined and what kind of physical phenomenon that causes the problem to be solved by the present disclosure will be examined as a comparative example. Incidentally, in order to calculate a reflection spectrum, a separation method was used, as a method that is capable of analyzing a diffraction grating having an arbitrary shape without restriction. The separation method is a method for analyzing a diffraction grating, which has a repeated structure of a high-refractive-index portion and a low-refractive-index portion having a lower refractive index than the high-refractive-index portion, as multiple reflection of a one-dimensional multilayer film. In the past, a mode coupling theory has been mainly used to analyze the diffraction grating used in the semiconductor optical device as in the present disclosure, but the mode coupling theory is not suitable for a detailed design in which elements of the diffraction grating are designed one by one, and the separation method is suitable for such a complex design.

Figure 3:
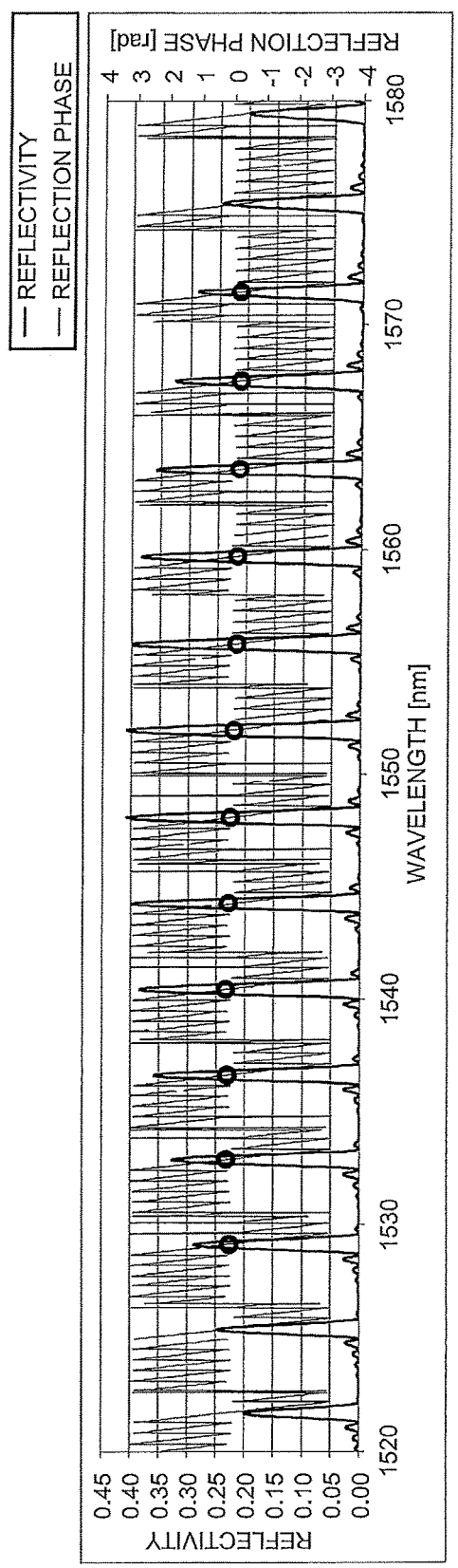
FIG. 3 is a graph illustrating an example of a reflection spectrum and a reflection phase of an SG.
Figure 4:
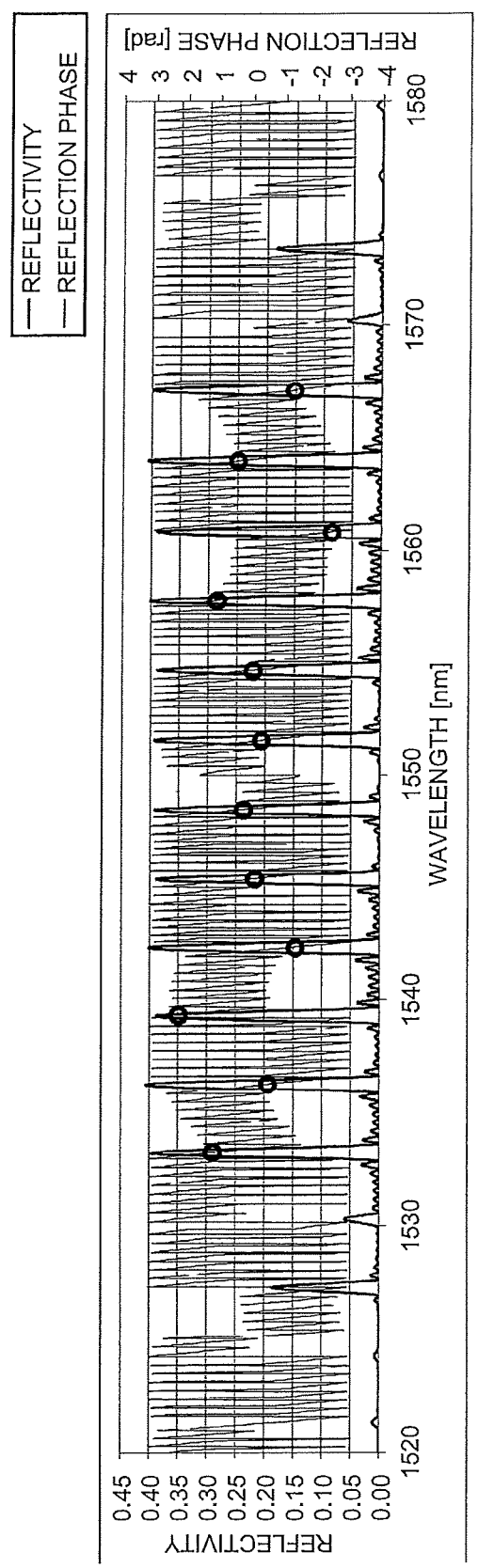
FIG. 4 is a graph illustrating an example of a reflection spectrum and a reflection phase of a BSG.

FIGS. 3 and 4 illustrate examples of reflection spectra and reflection phases of the SG and the BSG, respectively.

The gain of the active layer decreases as deviating from a center of a wavelength bandwidth, and a current value or a linewidth increase coefficient (a parameter) for obtaining a constant gain are increased. Thus, if a reflectivity decreases as deviating from a center wavelength, both the reflectivity and the active layer exhibit undesirable characteristics in a wavelength channel that deviates from the center wavelength. Therefore, it is preferable that the reflectivity of each peak of the reflection comb spectrum do not exhibit a wavelength dependency.

Regarding the SG, a reflection peak is the highest near the center of the reflection comb spectrum and decreases as deviating from the center as illustrated in FIG. 3. In order to reduce such a degree, the length of the diffraction grating included in each segment of the SG is shortened. Then, the reflection peak outside a desired wavelength-tunable bandwidth also becomes high.

On the other hand, regarding the BSG, a reflection comb spectrum in which there is almost no wavelength dependency of a reflectivity of a reflection peak at a predetermined bandwidth (for example, a bandwidth corresponding to a set laser emission wavelength bandwidth) and in which the reflection peak outside the bandwidth is suppressed is obtained without the above-described restriction as illustrated in FIG. 4. Here, the reflection phase means a phase when light having passed through a certain reference plane at a phase zero is reflected by a reflective element and returns to the reference plane.

Meanwhile, the reflection phases at the respective reflection peaks of the SG substantially coincide with each other at all the peaks as indicated by circles when viewed regarding the reflection phase. On the other hand, the reflection phases at the respective reflection peaks of the BSG are random with respect to the wavelength, which is different from the SG. The BSG is obtained by superimposing a plurality of diffraction gratings having different periods on each other while changing positions in the design thereof. Accordingly, the reflectivities at the plurality of wavelengths are aligned, but the reflection phases are different at the respective wavelengths because the positions of the diffraction gratings are different at the respective wavelengths. It is considered that this is the reason why the reflection phase at each reflection peak becomes random with respect to the wavelength.

A reflective phase having a linear dependency with respect to the wavelength can be easily compensated for by a waveguide having a certain length. That is, a phase change caused by light propagating through the certain length of the waveguide is also linear with respect to the wavelength, and thus, the phases at the reflection peaks are aligned if it is designed such that a result of adding two linear phases becomes an integral multiple of $2\pi$. Therefore, in the present specification, the reflection comb spectrum in which the reflection phases at the respective reflection peaks have the linear relationship with respect to the wavelength in this manner is expressed as that the reflection phases are aligned.

On the other hand, it is difficult to perform the compensation by insertion of the waveguide if the reflection phases at the respective reflection peaks are random with respect to the wavelength as in the BSG. In particular, when two reflection comb spectra having different sampling periods are used in combination (which is a configuration naturally necessary in order to obtain the vernier effect), it is difficult to compensate for such phase deviation. Alternatively, it is difficult to compensate for the phase deviation in the same manner even with a configuration in which the BSG and the SG are combined. Thus, in the case of using a reflective element that has a reflection comb spectrum in which a reflection phase at each reflection peak is random with respect to a wavelength, that is, the reflection phases are not aligned as in the BSG, a phase adjustment mechanism that tunes and adjusts a phase of light in an optical resonator is indispensable in order to implement a vernier type wavelength-tunable laser device. In addition, a passive region of the CSG-DR laser obtained by connecting a plurality of SGs having different sampling periods corresponds to the configuration in which the two reflection comb spectra having different sampling periods are used in combination, and it is also difficult to apply the BSG thereto.

According to the point that has become apparent newly with the above examination, the reason why the phase adjustment region is necessary in the case of using the BSG is that the phases are not aligned between the reflection peak wavelengths of the reflection comb spectrum. Therefore, the phase adjustment region is unnecessary in the case of a reflective element having a reflection comb spectrum in which reflection phases are aligned even if out-of-band reflection is suppressed in the reflective element. According to this configuration, it is possible to implement a wavelength-tunable laser that is easy to control and has a small characteristic variation for each wavelength channel. This finding corresponds to an aspect of the present disclosure.

Figure 5:
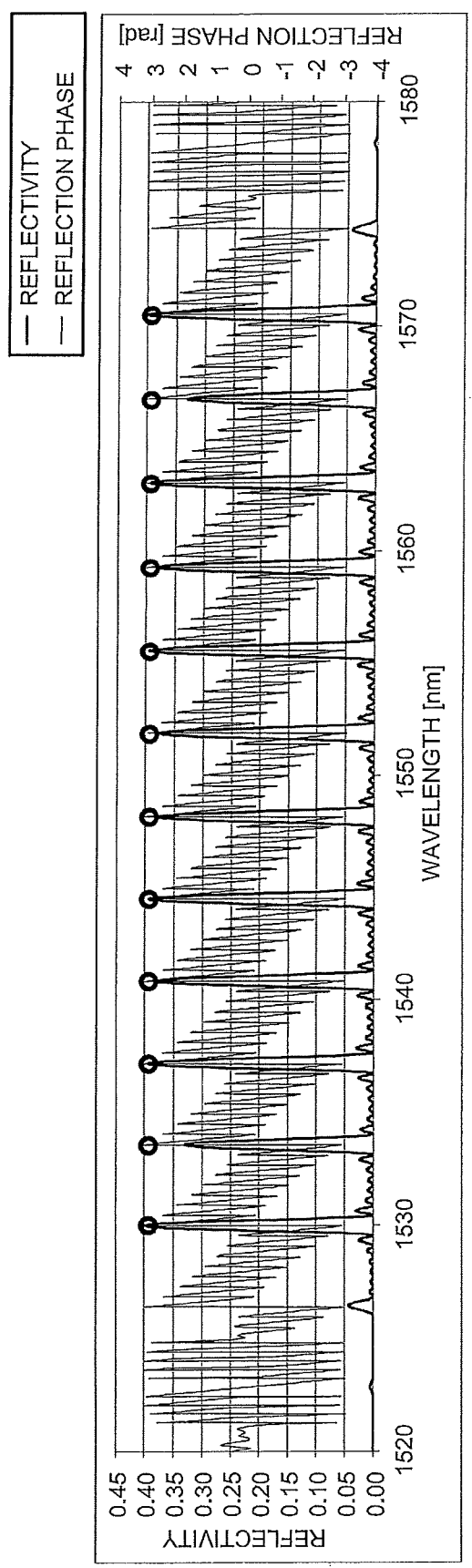
FIG. 5 is a graph illustrating an example of a reflection spectrum and a reflection phase of an SG according to a design adopted in the semiconductor laser device according to the first embodiment.

According to the above finding, a reflection peak outside a bandwidth is remarkably suppressed in a sinc-type SG adopting the design of the diffraction grating structure examined by the present inventors, reflection peaks within a bandwidth have high uniformity, and reflection phases substantially coincide with each other at all the reflection peaks as illustrated in FIG. 5. In the semiconductor laser device 100 according to the first embodiment, the diffraction grating layers 113 and 123 having the SG structure designed so as to have the above-described characteristics, thereby implementing the semiconductor laser device which is not necessarily provided with the phase adjustment region.

Hereinafter, consideration will be made about the diffraction grating structure that can obtain the reflection comb spectrum in which the reflection phases are aligned and the out-of-band reflection is suppressed. A diffraction grating that is not extremely strong (does not have a high reflectivity) can be designed by Fourier analysis. This means that the Fourier transform of a refractive index profile formed by the diffraction grating is approximately a reflectivity spectrum. Incidentally, this reflectivity spectrum is strictly in a wavenumber domain, but has one-to-one correspondence with a frequency or a wavelength, and can be regarded as having a linear correspondence in a narrow range.

First, the condition that the phases are aligned will be considered. The Fourier transform of a real symmetric one is in real symmetry according to the theory of Fourier analysis, a refractive index profile is a real number, and thus, a reflection spectrum of a diffraction grating structure which is substantially centrosymmetric with respect to a light progressing direction is real number, that is, has no phase change. Thus, to be the substantially centrosymmetric diffraction grating structure can be considered as a sufficient condition to make the phases aligned. For example, in a known SG, diffraction gratings of an element thereof are short uniform diffraction gratings and have a substantially centrosymmetric structure, and thus, correspond to the diffraction grating in which the phases are aligned. Incidentally, the BSG does not satisfy this condition.

Figure 6:
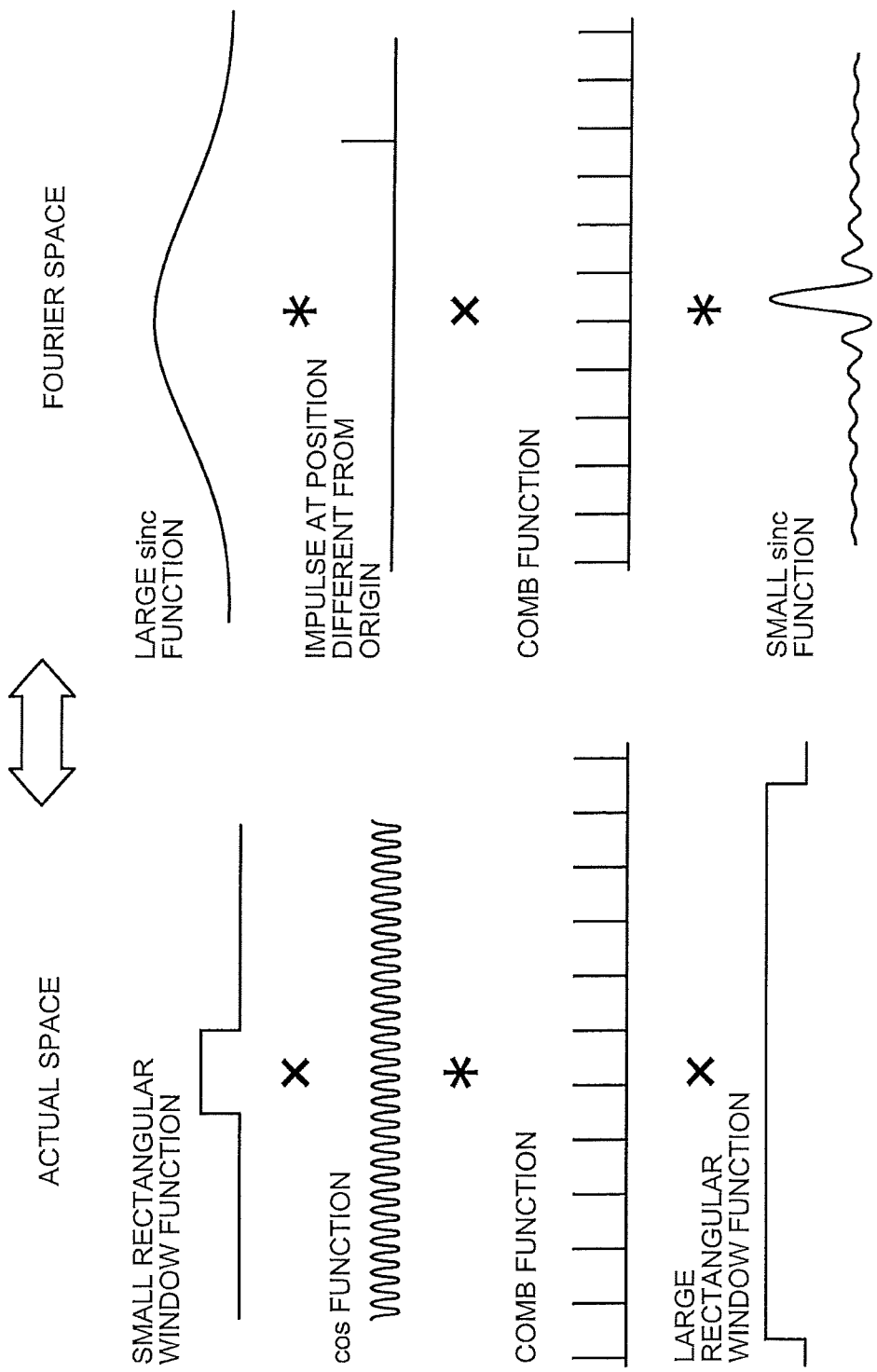
FIG. 6 is a view conceptually describing shapes of reflection spectra.

Further, the reflection spectrum will be considered. The Fourier transform of a rectangular window function is a sinc function. When considered based on this fact, the SG is obtained by convolution of one, obtained by multiplying a small rectangular window function by a cos function, and a comb function (or a shear function) and further multiplying the convoluted value by a larger rectangular window function. Thus, the Fourier transform of the SG is obtained by multiplying one obtained by frequency shift of a large sinc function (obtained by convolution of an impulse at a position different from the origin) by a comb function and further convoluting the multiplied value and a smaller sinc function (see FIG. 6). In this case, it is the large sinc function, which is the Fourier transform of the small rectangular window function, that determines an overall envelope of the plurality of reflection peaks. Thus, in the related art SG, the intensity of the reflection peak has a dependency of the sinc function with respect to the wavelength, the envelope is broadened but does not completely uniform if the diffraction grating of the element that determines the small window function is shortened, and conversely, it is difficult to suppress the peaks outside the bandwidth beyond the shape of the sinc function.

Figure 7:
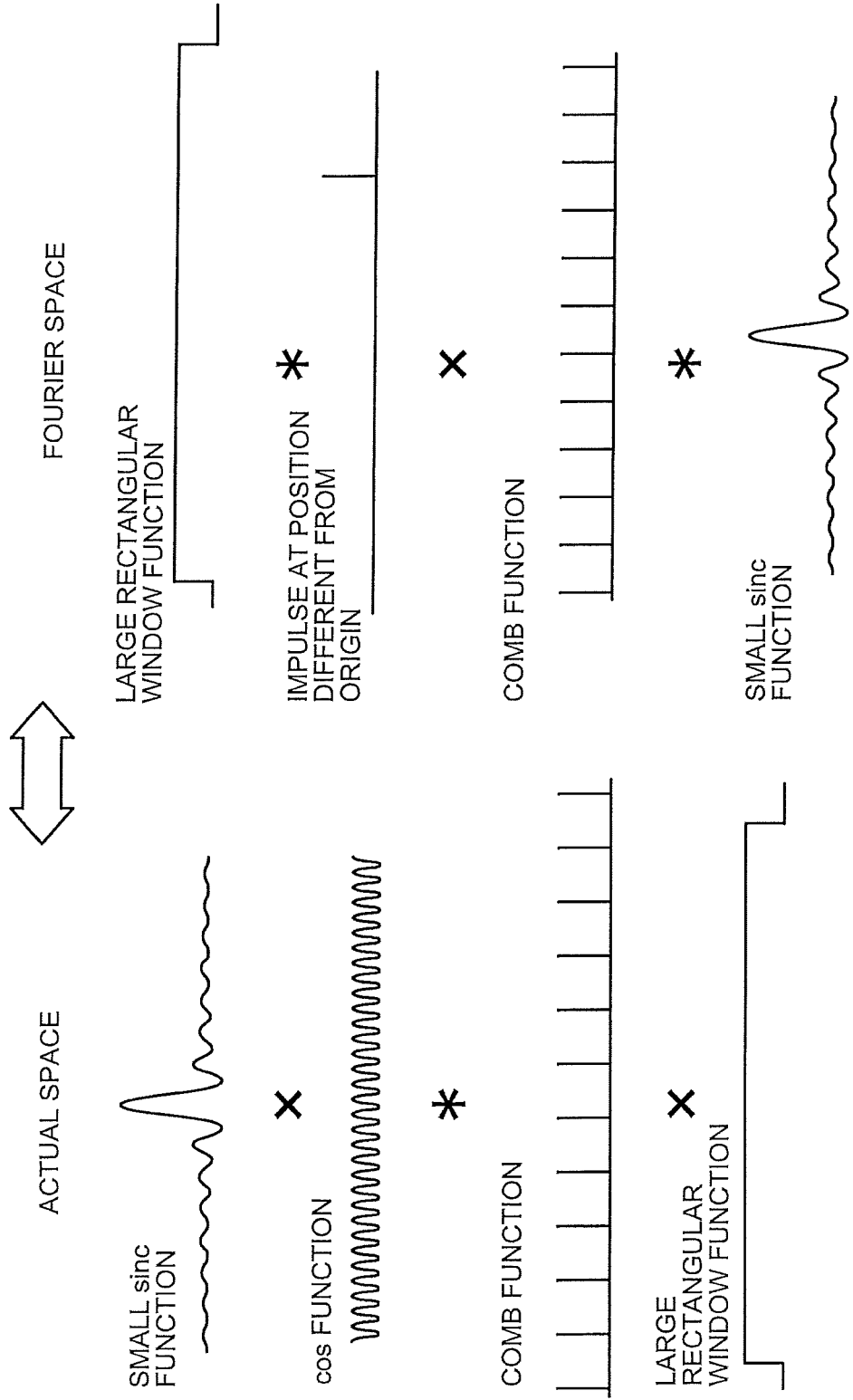
FIG. 7 is a view conceptually describing shapes of reflection spectra.

In this manner, the overall envelope of the reflection spectrum is determined by the smallest window function. Therefore, to form the diffraction grating of the element of the SG in another shape will be examined. The Fourier transform of the rectangular window function is the sinc function, and conversely, the Fourier transform of the sinc function is the rectangular window function. When utilizing this fact, if the diffraction grating of the element of the SG is set to a sinc function shape (obtained by multiplying a sinc function and a cos function), the envelope of reflection peaks of the SG becomes the rectangular window function. That is, if the diffraction grating is one, obtained by multiplying a small sinc function by a cos function, convoluting the multiplied value and a comb function, and further multiplying the convoluted value by a larger rectangular window function, the Fourier transform thereof is obtained by multiplying one obtained by frequency shift of a large rectangular window function (obtained by convolution of an impulse at a position different from the origin) by a comb function and further convoluting the multiplied value and a smaller sinc function (see FIG. 7). The reflection spectrum obtained as a result is a reflection spectrum in which reflection intensities among peaks are aligned and the reflection peaks outside the bandwidth are suppressed.

A method for designing the diffraction grating structure using the sinc function described above has been known, and there is an example obtained by applying this structure to a fiber Bragg grating in IEEE PHOTONICS TECHNOLOGY LETTERS, VOL. 10, No. 6, from pp. 842. However, there is neither motivation nor finding for the substantially centrosymmetric configuration in order to align the reflection phases in IEEE PHOTONICS TECHNOLOGY LETTERS, VOL. 10, No. 6, from pp. 842. Thus, the refractive index profile inside the sinc function is not centrosymmetric as can be understood when FIG. 1 in IEEE PHOTONICS TECHNOLOGY LETTERS, VOL. 10, No. 6, from pp. 842 is viewed in detail.

As described above, the diffraction grating structure in which the refractive index profile inside the sinc function is made substantially centrosymmetric using the sinc function-shaped element diffraction grating structure may be used as a method for implementing the diffraction grating capable of obtaining the reflection comb spectrum in which the reflection phases are aligned and the out-of-band reflection is suppressed.

Since the sinc function is a function indicating a continuous value between 1 and −1, it is difficult to completely implement the refractive index profile forming the diffraction grating structure only with the two kinds of high-refractive-index portion and low-refractive-index portion. A semiconductor optical device is generally fabricated using a combination of a layered structure, and a structure, for example, in which a refractive index difference is caused between a place where a diffraction grating layer is present and a place where a diffraction grating layer is absent, and the like, thereby to form a diffraction grating. Such various refractive indices may be continuously realized by adjusting a thickness of the diffraction grating layer so as to slightly differ depending on places. However, this is not necessarily easy. Thus, it is important to devise a form having high affinity for the semiconductor process when obtaining the sinc function-shaped diffraction grating.

Incidentally, one of methods thereof is to implement a portion for which a refractive index contrast is desirably reduced with a diffraction grating having a small duty ratio. However, it is difficult to precisely control and manufacture the diffraction grating having an extremely small duty ratio.

Therefore, the present inventors have devised a new method of implementing the magnitude of the refractive index by local omitting to be described later. Specifically, in a basic structure having a plurality of sets of a high-refractive-index portion and a low-refractive-index portion whose refractive index is lower than the high-refractive-index portion arranged in an alternately periodic manner in a predetermined direction (light progressing direction), at least one of the high-refractive-index portions is omitted, or at least one of the low-refractive-index portions is omitted, or at least one boundary between the high-refractive-index portion and the low-refractive-index portion is omitted, or a combination thereof is performed. In addition, the diffraction grating structure is set to have a structure including a plurality of portions in which the alternating arrangement of the high-refractive-index portion and the low-refractive-index portion is phase-shifted by ½ period from the basic structure.

That is, a portion is not omitted, if the reflection intensity of the diffraction grating is strong and an absolute value of the sinc function is close to 1 in the portion. Additionally, a portion is omitted, if the absolute value is smaller than 1 (for example, one omitted out of two if the absolute value is 0.5) in the portion.

When generalized, the method of designing the diffraction grating structure which is another aspect of the present disclosure is as follows.

First, an intensity function of the diffraction grating is determined by obtaining the Fourier transform of a desired reflection spectrum (for example, using a sinc function-shaped intensity function to obtain a rectangular reflection spectrum). At this time, if the desired reflection spectrum is set to have a real symmetric shape, the intensity function is a real function. This intensity function includes positive and negative values. In a portion where the intensity function becomes negative, the phase is inverted (positions of the high-refractive-index portion and the low-refractive-index portion in the basic structure are exchanged). In a portion where the absolute value of the intensity function is smaller than 1, 1 is not omitted and 0 is completely omitted in accordance with the magnitude thereof (in this portion, there is no diffraction grating structure in which the high-refractive-index portion and the low-refractive-index portion are alternately arranged).

It is an easy application to form the SG as a whole by periodically repeating the above-described diffraction grating structure. According to this method, it is possible to design an arbitrary reflection spectrum with a structure that can be easily realized without requiring precise control of the duty ratio or the like by using only two kinds of refractive index portions having high affinity for the semiconductor process.

Incidentally, the reflection phases almost coincide with each other at all the reflection peaks in the SG illustrated in FIG. 3 and the sinc-type SG illustrated in FIG. 5, but do not coincide with each other in some cases depending on how to take a reference plane on which reflection occurs. Even in such cases, there is no problem as long as a change for causing arrangement to be linear with respect to the wavelength. In the SG having the substantially centrosymmetric structure, the reflection phases coincide with each other at all the reflection peaks where the reference plane is placed at the center of an element diffraction grating structure, and the reflection phase is inverted between adjacent peaks where the reference plane is placed between element diffraction grating structures. Otherwise, a linear relationship is obtained, namely, the reflection phase becomes gradually different for each reflection peak.

When the reflection phases at the reflection peaks coincide with each other where the reference plane is placed between the element diffraction grating structures, a segment of the other end needs to be present at a position obtained by extending a segment of one end by a substantially integer period in order to make phase adjustment unnecessary in the case of forming the vernier using two opposing SGs. The phase adjustment becomes unnecessary regardless of any reflection peak with which oscillation is performed by forming a structure that microscopically sandwiches a phase shift of λ/4 (half of a diffraction grating period) in addition to this macroscopic arrangement.

Hereinafter, the design of the diffraction grating structure will be described in more detail.

Figure 8:
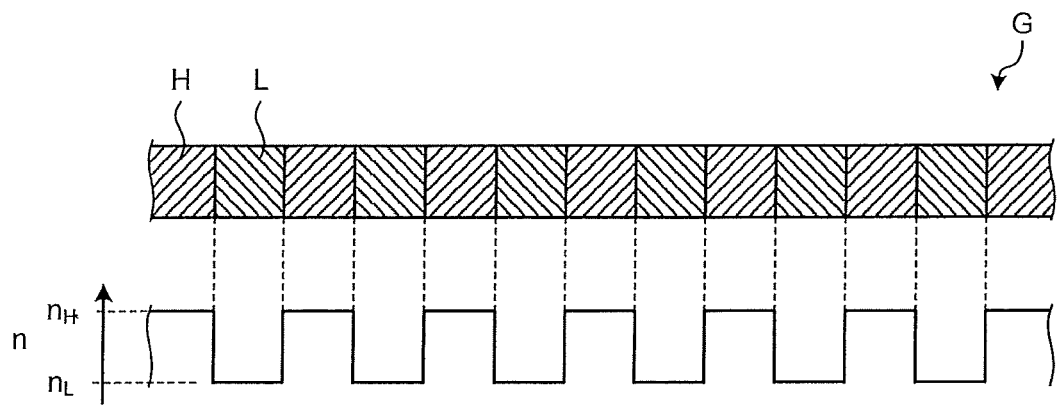
FIG. 8 is a view for describing a method of designing a diffraction grating structure.

First, a diffraction grating structure G, which has a basic structure in which a plurality of sets of a high-refractive-index portion H having a refractive index n of $n_H$ and a low-refractive-index portion L having a refractive index n of $n_L$ are alternately arranged in the light progressing direction, is considered as illustrated in FIG. 8. Hereinafter, a description will be given using a refractive index structure of the diffraction grating structure G. Incidentally, for example, the high-refractive-index portion H is made of GaInAsP having 1.23 Q and the low-refractive-index portion L is made of InP, but the disclosure is not particularly limited thereto.

Figure 9:
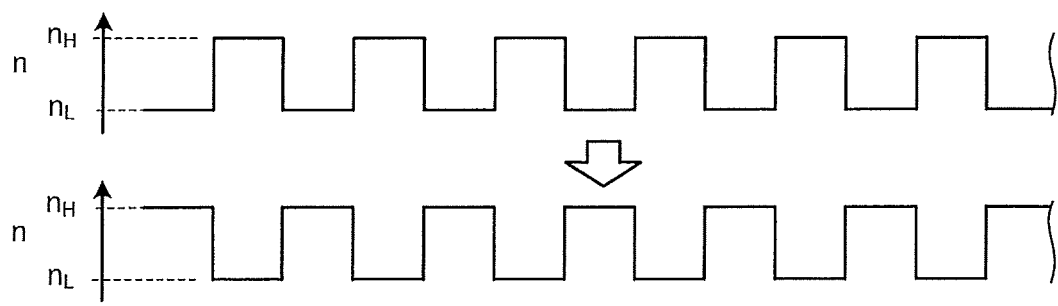
FIG. 9 is a view for describing the method of designing the diffraction grating structure.

Meanwhile, with respect to the phase inversion (having the same meaning as the insertion of the phase shift by the ½ period), the high-refractive-index portion and the low refractive index portion are exchanged for the refractive index structure of the diffraction grating structure G as illustrated in FIG. 9. This has the same meaning as the insertion of the phase shift by the ½ period between a place where phase inversion is not performed and a place where phase inversion is performed.

Next, omitting will be described, and two methods (omitting (A) and omitting (B)) will be described.

In the omitting (A), the high-refractive-index portion is regarded as one diffraction grating on the basis of the low-refractive-index portion.

Figure 10A:
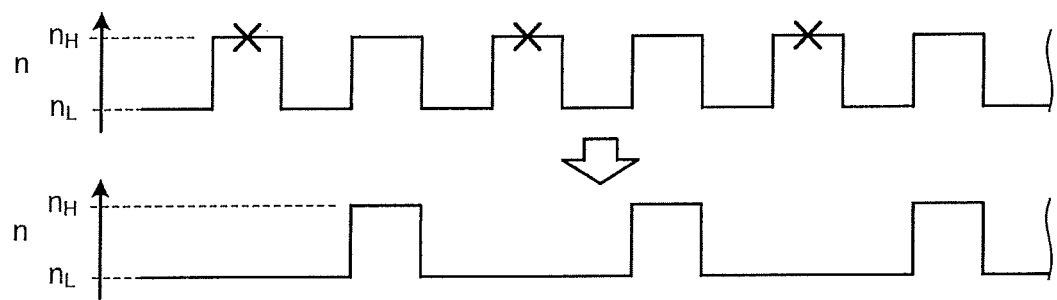
FIG. 10A is a view for describing the method of designing the diffraction grating structure.
Figure 10B:
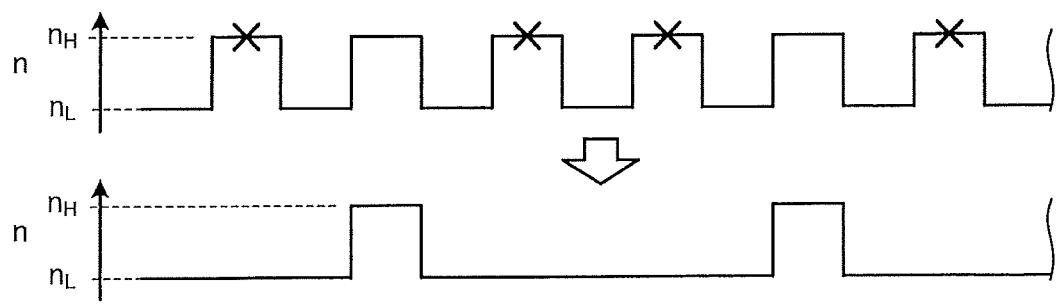
FIG. 10B is a view for describing the method of designing the diffraction grating structure.

Then, the high refractive portion indicated by "x" can be omitted by setting the high-refractive-index portion to the low-refractive-index portion for the refractive index structure of the diffraction grating structure G as illustrated in FIGS. 10A and 10B. For example, when the intensity function is ½, the high-refractive-index portion is omitted at a rate of one out of two as illustrated in FIG. 10A. When the intensity function is ⅓, the high-refractive-index portion is omitted at a ratio of two out of three as illustrated in FIG. 10B.

Incidentally, the omitting is performed by changing the high-refractive-index portion into the low-refractive-index portion for the refractive index structure of the diffraction grating structure G in the above-described omitting (A), but it is also possible to perform the same omitting as the omitting (A) by changing the low-refractive-index portion to the high-refractive-index portion.

FIG. 11 is a graph illustrating a portion on one side from the center of the centrosymmetric sinc-type intensity function and the refractive index structure of the diffraction grating structure implementing this intensity function by the omitting (A). As can be understood from FIG. 11, the density of the high-refractive-index portions changes depending on the magnitude of an absolute value of the intensity function. In addition, the refractive index structure is phase inverted in a portion where the sign of the intensity function changes.

Figure 12A:
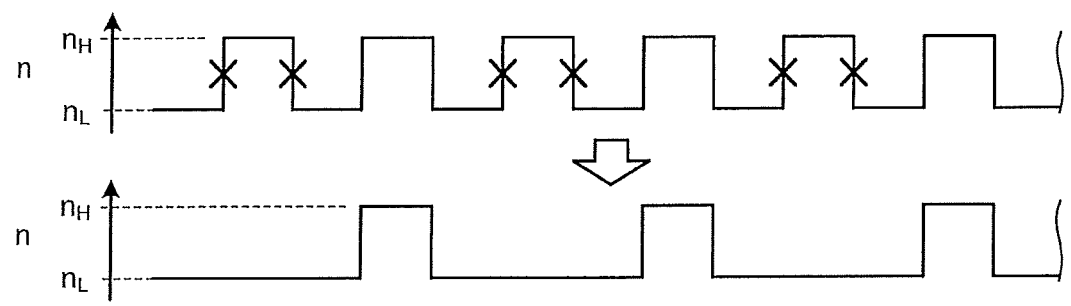
FIG. 12A is a view for describing the method of designing the diffraction grating structure.
Figure 12B:
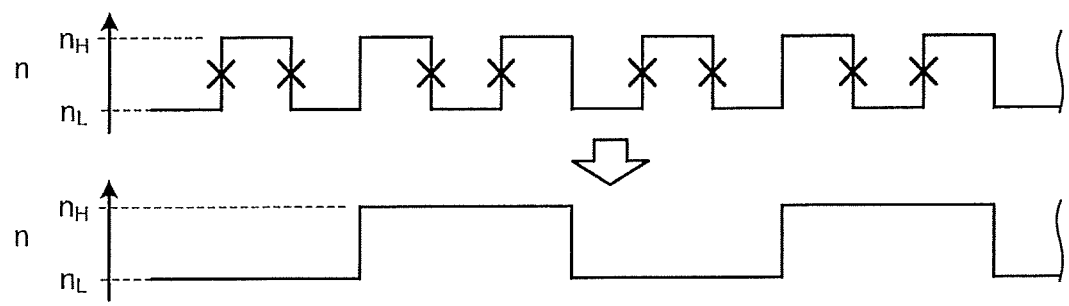
FIG. 12B is a view for describing the method of designing the diffraction grating structure.

On the other hand, a change in refractive index is regarded as one diffraction grating in the omitting (B). A position at which a refractive index changes from a high refractive index to a low refractive index or a position at which a refractive index changes from a low refractive index to a high refractive index, that is, a boundary between the high-refractive-index portion and the low-refractive-index portion is a minute reflection point of light and is an element forming the diffraction grating. Based on this way of consideration, omitting can be performed by deleting the boundary between the high-refractive-index portion and the low-refractive-index portion as indicated by "x", for the refractive index structure of the diffraction grating structure G as illustrated in FIGS. 12A and 12B. However, when a boundary at which a high-refractive-index portion is changed to a low-refractive-index portion is deleted, it is necessary to surely delete an adjacent boundary at which a low-refractive-index portion is changed to a high-refractive-index portion.

At this time, a ratio of deleted boundaries relative to the number of boundaries in the refractive index structure of the diffraction grating structure G is made to be the intensity function. As illustrated in FIG. 12A, when the intensity function is ½, a pattern of the refractive index structure obtained as a result of omitting is the same as that of the case of the omitting (A) illustrated in FIG. 10A. However, when the intensity function is ⅓, the pattern obtained as illustrated in FIG. 12B is different from a pattern of the omitting (A) illustrated in FIG. 10B. This difference occurs because there are both of a point where a high-refractive-index portion is replaced with a low refractive index and a point where a low-refractive-index portion is replaced with a high refractive index in the omitting (B) while only a high-refractive-index portion is replaced with a low refractive index in the omitting (A).

Therefore, it is possible not only to define the omitting (A) and the omitting (B) by performing either the replacement of a high-refractive-index portion with a low refractive index or the replacement of a low-refractive-index portion with a high refractive index, or appropriately combining the both, but also to devise another omitting method.

Figure 13:
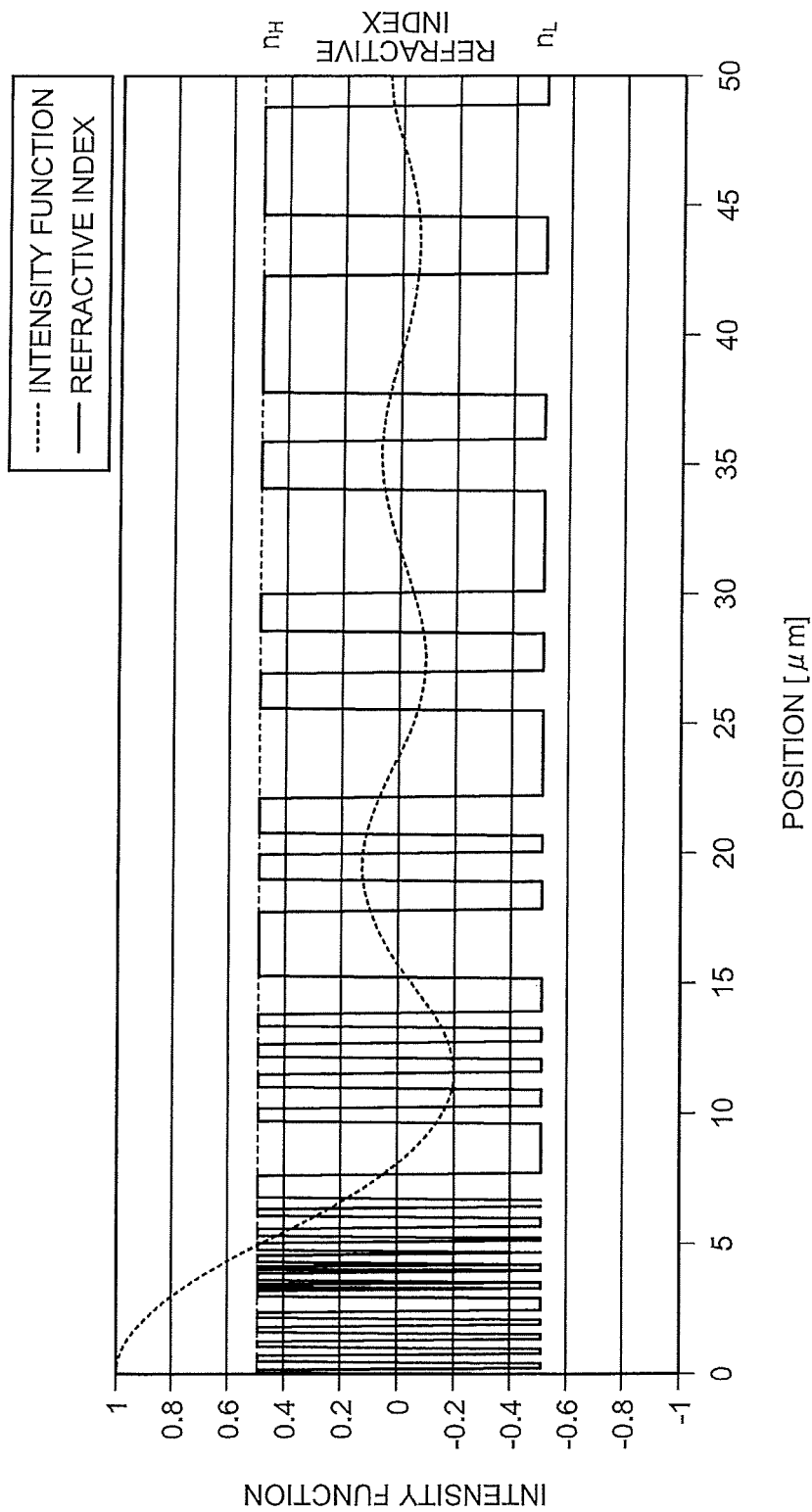
FIG. 13 is a graph illustrating an intensity function and a refractive index structure of a diffraction grating structure.

FIG. 13 is a graph illustrating a portion on one side from the center of the centrosymmetric sinc-type intensity function and the refractive index structure of the diffraction grating structure implementing this intensity function by the omitting (B). As can be understood from FIG. 13, the density of the boundaries among the high-refractive-index portions and the low-refractive-index portions varies depending on the magnitude of the absolute value of the intensity function. In addition, the refractive index structure is phase inverted in a portion where the sign of the intensity function changes.

Incidentally, any of the above-described two omitting methods may be used when designing the diffraction grating, but the omitting (B) is better in terms that a finer intensity function can be expressed. In particular, the omitting (B) is highly advantageous in the case of a design in which an intensity function changes during a short period number.

In order to implement the pattern of the refractive index structure determined by the above-described method, each of the high-refractive-index portion and the low-refractive-index portion is arranged with a length of $\lambda/4$ (¼ of a wavelength of laser light in a medium) in the actual diffraction grating structure. At this time, a length corresponding to $\lambda/4$ is different between the high-refractive-index portion and the low-refractive-index portion, and thus, it is preferable to perform correction for the difference. In other words, it is preferable to make the high-refractive-index portion short in accordance with its refractive index and make the low-refractive-index portion longer than the high-refractive-index portion. In particular, when the pattern of refractive index structure is generated by the omitting (A), there is a region where the low-refractive-index portion is continuous to be long, and thus, it is likely to be important to correct the length since a slight error in the length accumulates to cause phase fluctuations.

Incidentally, the intensity function is given as sinc (x$\pi$/xwin) in the design of the diffraction grating structures of the diffraction gratings G1, G2, and G3 of the diffraction grating layers 113, 123 of the semiconductor laser device 100 according to the first embodiment. Here, xwin is set to 8.1 μm for all the diffraction gratings G1, G2, and G3. The sampling period of the segment 113a of the diffraction grating layer 113 of the gain SG section 110 is 666 times of a diffraction grating period of the diffraction grating G1 and the number of segments is six. In addition, there is one segment that has no diffraction grating as described above. Each sampling period of the segments 123a and 123b in the diffraction grating layer 123 of the passive SG section 120 is 768 times of each diffraction grating period of the diffraction gratings G2 and G3. As a result, the reflection comb spectra illustrated in FIG. 2 are obtained.

Figure 14:
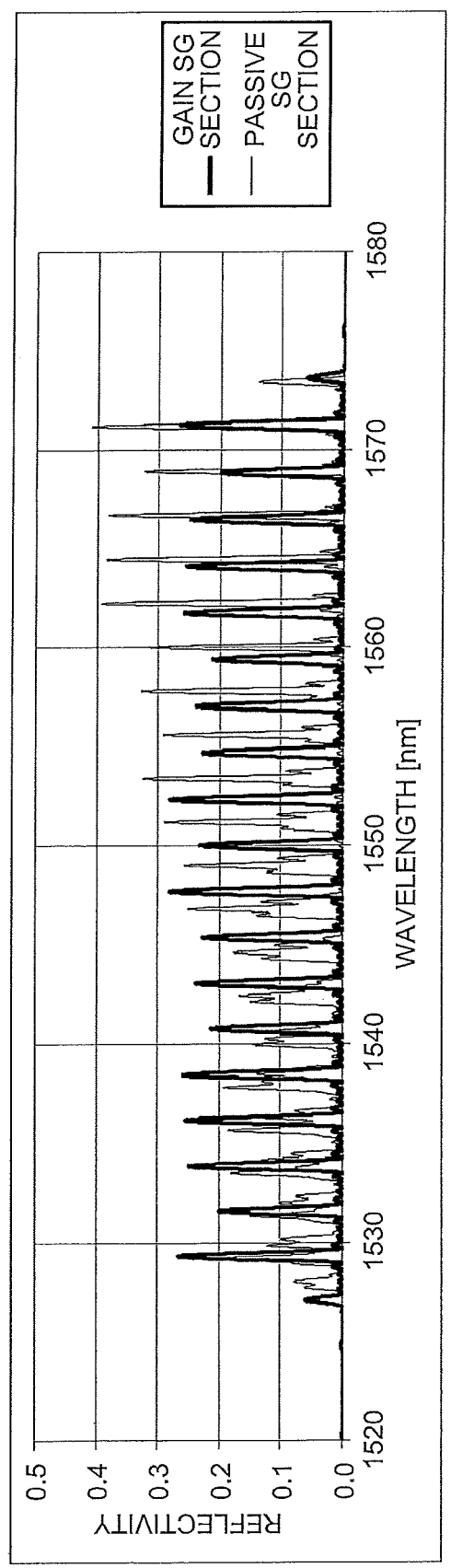
FIG. 14 is a graph illustrating an example of reflection spectra of a gain SG section and a passive SG section.
Figure 15:
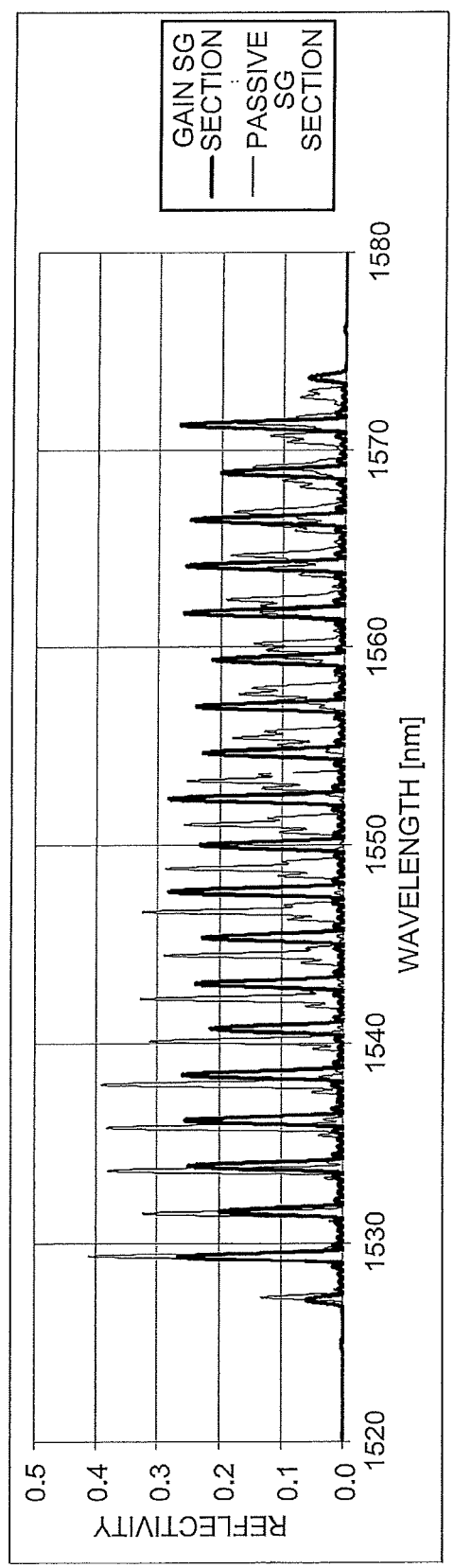
FIG. 15 is a graph illustrating an example of reflection spectra of a gain SG section and a passive SG section.

In addition, the diffraction grating layer 123 of the passive SG section 120 is designed to have the reflection comb spectrum suitable for laser emission at the center of the laser emission wavelength bandwidth in the above-described first embodiment, but can be designed to have a reflection comb spectrum suitable for laser emission on a long wavelength side of the laser emission wavelength bandwidth (see FIG. 14) or designed to have a reflection comb spectrum suitable for laser emission on a short wavelength side (see FIG. 15). Even when the semiconductor laser device is operated so as to perform laser emission on either the long wavelength side or the short wavelength side, the reflection outside the laser emission wavelength bandwidth is suppressed by the effect of the present disclosure and additionally the regression mode is suppressed by the vernier effect inside the CSG-DBR structure. Therefore, a laser emission wavelength can be favorably selected. When the diffraction grating according to the first embodiment of the present disclosure is used in the wavelength-tunable laser, it is possible to implement an emission frequency linewidth of 100 kHz or lower within the laser emission wavelength bandwidth.

Second Embodiment

A diffraction grating structure according to a designing method according to one aspect of the present disclosure is not applicable only to the CSG-DR laser. The diffraction grating structure can be applied to improve performance of various semiconductor optical devices if utilizing a characteristic that an arbitrary reflection spectrum can be easily realized.

Figure 16:
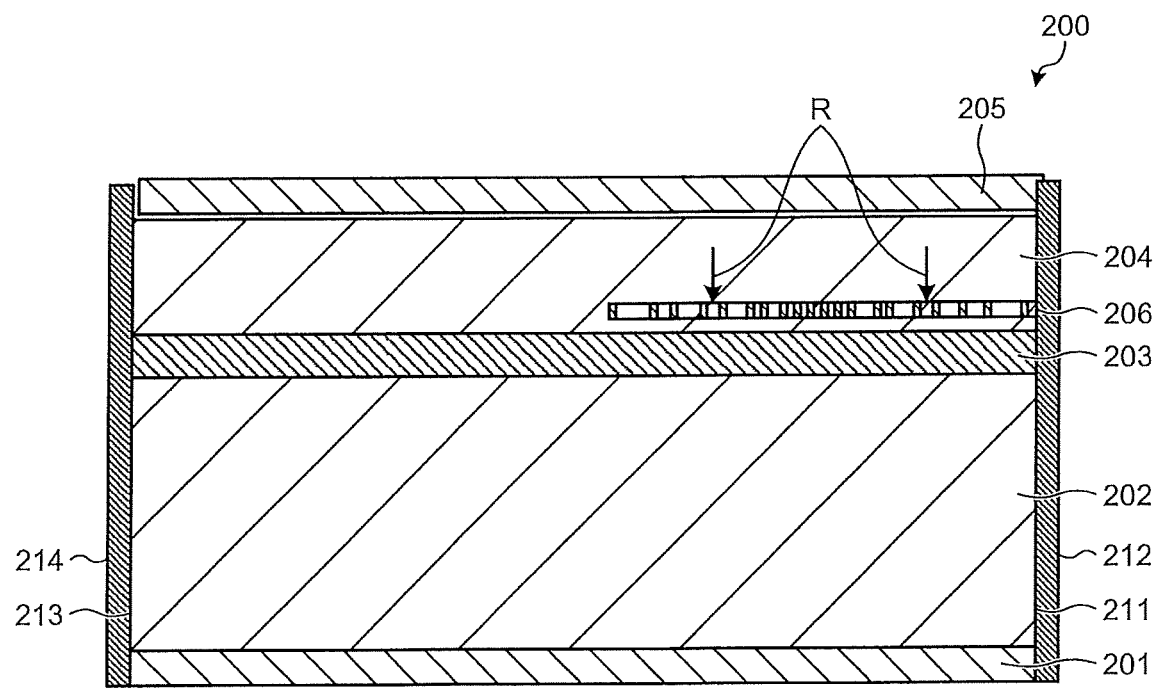
FIG. 16 is a schematic cross-sectional view of a semiconductor laser device according to a second embodiment cut along an optical waveguide direction.

FIG. 16 is a schematic cross-sectional view of a semiconductor laser device according to a second embodiment cut along an optical waveguide direction. A semiconductor laser device 200 is called an inner grating multimode (iGM) laser having a partial diffraction grating inside the device (FURUKAWA ELECTRIC REVIEW No. 112 (July 2003), from pp. 5).

The semiconductor laser device 200 includes: an n-type semiconductor layer 202 having an n-side electrode 201 formed on a back face thereof; an active layer 203 formed on the n-type semiconductor layer 202; a p-type upper cladding layer 204 formed on the active layer 203; a p-side electrode 205 formed on the p-type upper cladding layer 204; a diffraction grating layer 206 provided along the active layer 203 in the vicinity of the active layer 203 inside the p-type upper cladding layer 204; a low reflectivity film 212 serving as a first reflection film formed on a facet 211; and a high reflectivity film 214 formed on a facet 213 and serving as a second reflection film having a higher reflectivity than the low reflectivity film 212. The active layer 203 is arranged between the low reflectivity film 212 and the high reflectivity film 214.

The n-type semiconductor layer 202 has a structure in which a lower cladding layer made of n-type InP is formed on a substrate made of n-type InP. The p-type upper cladding layer 204 is made of p-type InP. The diffraction grating layer 206 has a diffraction grating structure in which a portion between p-type GaInAsP layers each having 1.23 Q, which are discretely arranged, is embedded with the same semiconductor material (p-type InP) as the p-type upper cladding layer 204. The active layer 203 is made of GaInAsP and has an MQW-SCH structure.

As described above, the semiconductor laser device 200 has the facet 211 with a low reflectivity and the facet 213 with a high reflectivity, and the short diffraction grating layer 206 is provided in the vicinity of the facet 211. Further, an optical resonator is formed of a reflection mirror having a reflection wavelength bandwidth limited by the diffraction grating structure of the diffraction grating layer 206 and a reflection mirror by the high-reflectivity facet 213, thereby performing laser emission. A difference between an iGM laser and a DFB laser is that a distance between the diffraction grating layer 206 and the high-reflectivity facet 213 is spaced apart from each other to certain extent, and accordingly, multi-mode emission is performed in a plurality of longitudinal modes within a range of a reflection bandwidth of the diffraction grating layer 206. For example, when the iGM laser is used for an application of a pumping light source of an optical fiber amplifier, it is possible to suppress light returning from an optical fiber due to stimulated Brillouin scattering by properly selecting the number of emission modes (longitudinal modes).

An overall length of the semiconductor laser device 200 is, for example, 2500 µm. A diffraction structure of the diffraction grating layer 206 is set depending on the above-described design. Other design values relating to the semiconductor laser device 200 may be determined by known methods as appropriate.

A widely used iGM laser employs simply a short diffraction grating having a diffraction grating structure in which a plurality of sets of a high-refractive-index portion and a low-refractive-index portion are arranged in an alternately periodic manner. Thus, while a reflection bandwidth of a diffraction grating is limited, there is a minute variation in reflectivity within the bandwidth (a reflection spectrum of the short diffraction grating is given in a sinc function shape similarly to the description in the first embodiment). When the reflectivity varies depending on a wavelength in this manner, a threshold gain varies among a plurality of modes. Although emission is likely to occur in a mode with a high threshold gain due to an effect such as spectral hole burning at the time of injection of a high current, emission first starts from a mode with a small threshold gain at the time of injection of a low current, which causes a variation in the number of emission modes depending on a driving condition.

On the other hand, in the semiconductor laser device 200 according to the second embodiment, the diffraction grating layer 206 has a flat top reflection spectrum as being designed using the above-described diffraction grating designing method. As a result, the number of emission modes is stable irrespective of the driving condition.

Figure 17:
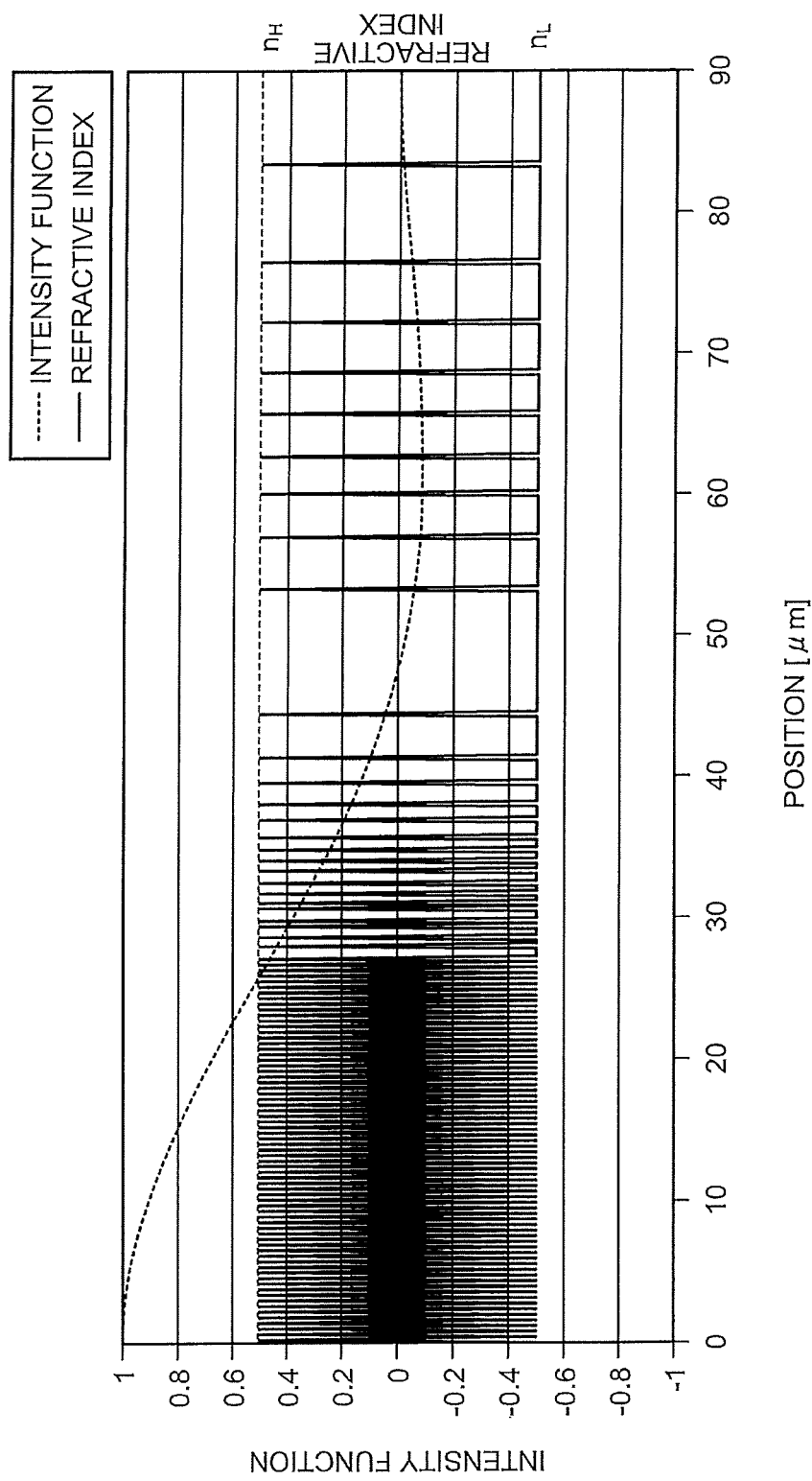
FIG. 17 is a graph illustrating a refractive index structure and an intensity function of a diffraction grating structure.

Specifically, $(0.54+0.46 \cos(x\pi/2.2 \ w)) \times \text{sinc}(x\pi/w)$, where $|x|<2 \ w$, which is modification of a known flat top window function, is used as the intensity function of the diffraction grating in the diffraction grating structure of the diffraction grating layer 206. Since the design of the window function is generally based on a guideline that a desired shape is to be obtained by the Fourier transform, such a method using the well-known window function as the intensity function of a shape to be obtained by the Fourier transform of the desired reflectivity spectrum is preferable. Incidentally, w is set to 48 µm. FIG. 17 illustrates the intensity function and the refractive index structure (obtained by omitting (A)) corresponding thereto. Since this intensity function is also centrosymmetric, only the portion on one side from the center is displayed. In addition, the refractive index structure is phase inverted in a portion where the sign of the intensity function changes, in other words, there is a phase shift by a ½ period at the center of a display range.

Incidentally, arrows R in FIG. 16 indicate positions where the phase shift occurs in the diffraction grating layer 206.

Figure 18:
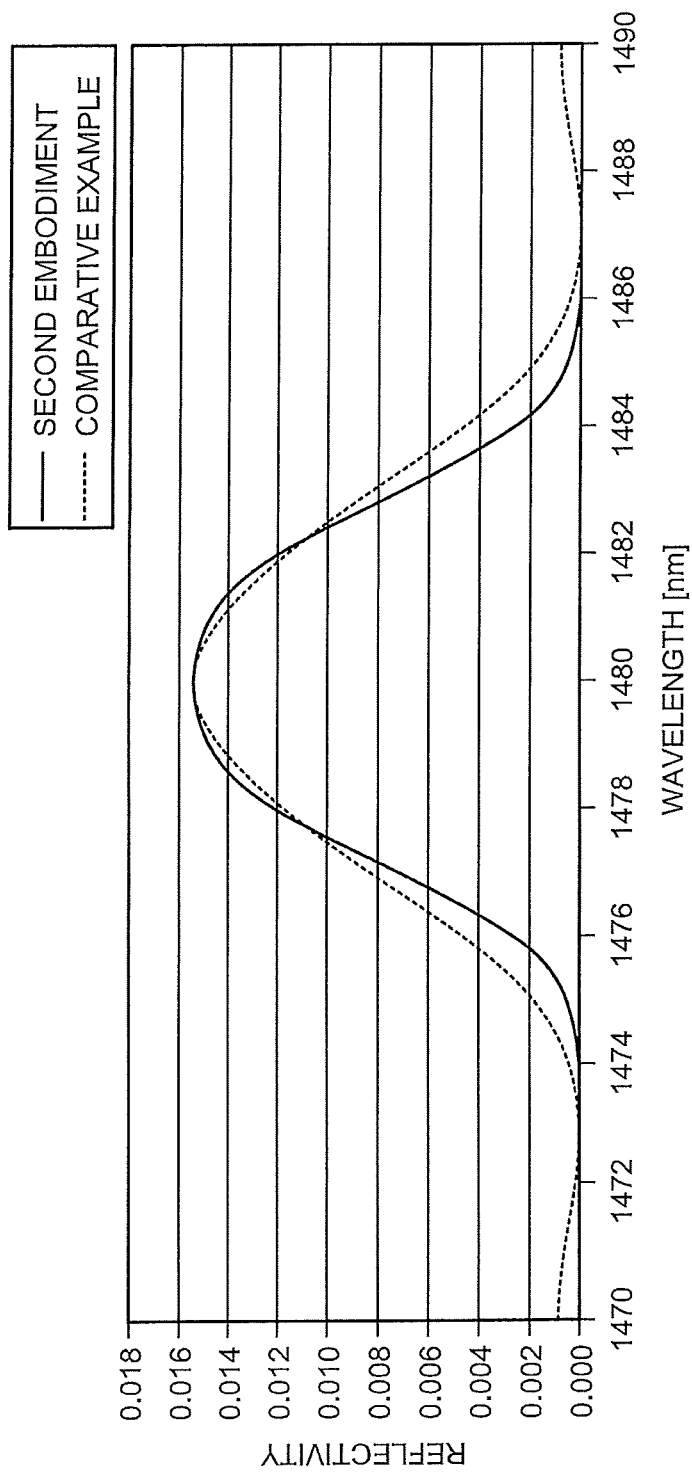
FIG. 18 is a graph illustrating a reflection spectrum of a diffraction grating layer.

FIG. 18 illustrates a calculation result of the flat top reflection spectrum obtained by the diffraction grating layer 206 of the second embodiment and the reflection spectrum of the related art diffraction grating. The reflection spectrum obtained by the diffraction grating layer 206 of the second embodiment has a flat reflection peak which is obvious as compared with a comparative example.

Even in the related art diffraction grating, a flat top reflectivity can be obtained in a design region where a coupling coefficient is high and the reflectivity is close to 1. This is because the reflectivity never exceeds 1 unless amplification is considered so that a shape in which peaks are gradually saturated is formed as the diffraction grating is strengthened. However, the reflectivity required for the diffraction grating is not necessarily high based on the design of the laser. For example, in a high-power laser for optical fiber amplifier excitation, which is a main application of the iGM laser, it is desirable that the reflectivity be not so high in order to achieve high efficiency. Therefore, the flat top obtained by making the high reflectivity with the related art diffraction grating is not available in practice. In contrast, a flat top spectral shape can be implemented with an appropriately low reflectivity of around 1 in the diffraction grating according to the design disclosed in the present specification, and thus, the diffraction grating is suitable for a laser such as the iGM laser.

Incidentally, the multi-mode emission with the stable number of modes is obtained from the time of injection of the low current to the time of injection of the high current in the semiconductor laser device 200 according to the second embodiment.

Incidentally, an optical element is the semiconductor laser device in the above embodiments, but the present disclosure is not limited to the semiconductor laser device. For example, the optical element may be a Bragg reflector that does not have an active layer and functions as a reflective element that reflects input light with a high reflectivity. At this time, a wavelength of the input and reflected light means an operation wavelength of the Bragg reflector. Therefore, the Bragg reflector is designed such that a wavelength of light that needs to be input is longer than a center wavelength of a reflection wavelength bandwidth.

In addition, all the diffraction grating layers as the reflective elements are configured using the passive waveguide core layer in the semiconductor laser device according to the above embodiments, but the diffraction grating layer may include a light-emitting region.

According to the present disclosure, provided are a semiconductor laser device which does not necessarily have a phase adjustment region, and a diffraction grating structure and a diffraction grating for implementing the same.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vernier-type wavelength-tunable semiconductor laser device comprising
   an optical resonator, constituted by first and second reflective elements having reflection comb spectra in which reflection peaks are arranged on a wavelength axis in a substantially periodic manner and having mutually different periods,
   wherein at least one of the first and second reflective elements has a sampled grating structure having a reflection comb spectrum in which reflection phases at the respective reflection peaks are aligned and an intensity of a reflection peak outside a set laser emission wavelength bandwidth is lower than an intensity of a reflection peak within the laser emission wavelength bandwidth, wherein
   a plurality of reflection peaks adjacent to each other within the set laser emission wavelength bandwidth have substantially the same magnitude and at least two reflection peaks outside the set laser emission wavelength bandwidth at the two ends therein have magnitude less than said same magnitude, and
   reflection phases substantially coincide with each other at all the reflection peaks in the reflection comb spectra without providing a phase adjustment region to perform phase adjustment in the vernier-type wavelength-tunable semiconductor laser device.

2. The vernier-type wavelength-tunable semiconductor laser device according to claim 1, wherein at least one of the first and second reflective elements has a light-emitting region.

3. A vernier-type wavelength-tunable semiconductor laser device comprising
   an optical resonator, constituted by first and second reflective elements having reflection comb spectra in which reflection peaks are arranged on a wavelength axis in a substantially periodic manner and having mutually different periods,
   wherein at least one of the first and second reflective elements is a diffraction grating having a sampled grating structure including a plurality of diffraction grating structures, each of the diffraction grating structures having a structure that is substantially centrosymmetric in a light progressing direction, and has the sampled grating structure having a reflection comb spectrum in which an intensity of a reflection peak outside a set laser emission wavelength bandwidth is lower than an intensity of a reflection peak within the laser emission wavelength bandwidth, wherein
   a plurality of reflection peaks adjacent to each other within the set laser emission wavelength bandwidth have substantially the same magnitude and at least two reflection peaks outside the set laser emission wavelength bandwidth at the two ends therein have magnitude less than said same magnitude, and
   reflection phases substantially coincide with each other at all the reflection peaks in the reflection comb spectra without providing a phase adjustment region to perform phase adjustment in the vernier-type wavelength-tunable semiconductor laser device.

4. The vernier-type wavelength-tunable semiconductor laser device according to claim 3, wherein at least one of the first and second reflective elements has a light-emitting region.

5. A vernier-type wavelength-tunable semiconductor laser device comprising
   an optical resonator, constituted by first and second reflective elements having reflection comb spectra in which reflection peaks are arranged on a wavelength axis in a substantially periodic manner and having mutually different periods,
   wherein at least one of the first and second reflective elements is a diffraction grating of a sampled grating structure including a plurality of diffraction grating structures,
   a plurality of sets of a high-refractive-index portion and a low-refractive-index portion having a lower refractive index than the high-refractive-index portion are alternately arranged in a predetermined direction in the diffraction grating structure, wherein
   the sampled grating of at least the first and second reflective elements includes regions, which include respective segments, each of the segments being formed of a diffraction grating and a waveguide region, which is connected to the diffraction grating, arranged in an optical waveguide direction, and is continuously present in only the diffraction grating of each of the segments, when a structure in which a plurality of sets of the high-refractive-index portion and the low-refractive-index portion are arranged in an alternately periodic manner is set as a basic structure, the diffraction grating structure has a structure formed by omitting at least one of the high-refractive-index portions from the basic structure, omitting at least one of the low-refractive-index portions, omitting at least one boundary between the high-refractive-index portion and the low-refractive-index portion, or performing a combination thereof, and the diffraction grating structure has a structure including a plurality of portions with alternating arrangement of the high-refractive-index portion and the low-refractive-index portion phase shifted by a ½ period from the basic structure, wherein a plurality of reflection peaks adjacent to each other within a set laser emission wavelength bandwidth have substantially the same magnitude and at least two reflection peaks outside the set laser emission wavelength bandwidth at the two ends therein have magnitude less than said same magnitude, and reflection phases substantially coincide with each other at all the reflection peaks in the reflection comb spectra without providing a phase adjustment region to perform phase adjustment in the vernier-type wavelength-tunable semiconductor laser device.

6. The vernier-type wavelength-tunable semiconductor laser device according to claim 5, wherein at least one of the first and second reflective elements has a light-emitting region.

7. The vernier-type wavelength-tunable semiconductor laser device according to claim 5, wherein the diffraction grating structure has a structure approximately providing a shape obtained by Fourier formation of a desired reflectivity spectrum.

8. The vernier-type wavelength-tunable semiconductor laser device according to claim 5, wherein the diffraction grating structure has a structure approximately providing a sinc function shape obtained by Fourier formation of a rectangular window function.

9. The vernier-type wavelength-tunable semiconductor laser device according to claim 8, wherein the diffraction grating structure has a structure that is substantially centrosymmetric in the predetermined direction.

10. The vernier-type wavelength-tunable semiconductor laser device according to claim 1, wherein
the sampled grating structure includes a plurality of diffraction grating structures, and in the diffraction grating structures a refractive index profile inside sinc function is made substantially centrosymmetric.

11. The vernier-type wavelength-tunable semiconductor laser device according to claim 3, wherein
in the diffraction grating structures a refractive index profile inside sinc function is made substantially centrosymmetric.

12. The vernier-type wavelength-tunable semiconductor laser device according to claim 5, wherein
in the diffraction grating structures a refractive index profile inside sinc function is made substantially centrosymmetric.

* * * * *